United States Patent
Ishida et al.

(10) Patent No.: US 12,165,958 B2
(45) Date of Patent: Dec. 10, 2024

(54) POWER STORAGE PACK, SEMICONDUCTOR DEVICE, AND SEMICONDUCTOR DEVICE MANUFACTURING METHOD

(71) Applicant: Nuvoton Technology Corporation Japan, Kyoto (JP)

(72) Inventors: Toshifumi Ishida, Osaka (JP); Kouki Yamamoto, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/674,329

(22) Filed: May 24, 2024

(65) Prior Publication Data

US 2024/0312881 A1 Sep. 19, 2024

Related U.S. Application Data

(63) Continuation of application No. PCT/JP2023/025486, filed on Jul. 10, 2023.

(30) Foreign Application Priority Data

Dec. 22, 2022 (JP) .................. 2022-205527

(51) Int. Cl.
*H01L 23/00* (2006.01)
*H01L 23/495* (2006.01)

(52) U.S. Cl.
CPC ........ *H01L 23/49562* (2013.01); *H01L 24/16* (2013.01); *H01L 24/40* (2013.01);
(Continued)

(58) Field of Classification Search
None
See application file for complete search history.

(56) References Cited

U.S. PATENT DOCUMENTS

| 2001/0048116 | A1 | 12/2001 | Standing et al. |
| 2019/0295932 | A1 | 9/2019 | Nakata et al. |
| 2024/0063073 | A1* | 2/2024 | Yoshimatsu ............ H01L 24/40 |

FOREIGN PATENT DOCUMENTS

| CN | 101621051 A | * | 1/2010 | ............. H01L 24/95 |
| CN | 104716129 B | * | 8/2017 | ............. H01L 24/36 |

(Continued)

OTHER PUBLICATIONS

International Search Report dated Sep. 19, 2023 issued in International Patent Application No. PCT/JP2023/025486.

(Continued)

*Primary Examiner* — Michele Fan
(74) *Attorney, Agent, or Firm* — Rimon P.C.

(57) ABSTRACT

A power storage pack includes: a power storage cell; a power storage tab; a protection circuit substrate; a semiconductor element; and a metal plate for power storage tab joint that is connected to the semiconductor element on the first main surface of the metal plate for power storage tab joint and that includes a portion whose thickness is at most 0.2 mm. The metal plate for power storage tab joint is joined to the power storage tab on the second main surface of the metal plate for power storage tab joint to include an overlap portion in which the power storage tab, the metal plate for power storage tab joint, the semiconductor element, and the protection circuit substrate overlap each other; and there is a portion in which a region that may be the conduction path between the power storage tab and the protection circuit substrate overlaps the overlap portion.

18 Claims, 28 Drawing Sheets

(52) U.S. Cl.
CPC .... *H01L 24/73* (2013.01); *H01L 2224/16227* (2013.01); *H01L 2224/40245* (2013.01); *H01L 2224/73255* (2013.01)

(56) References Cited

FOREIGN PATENT DOCUMENTS

| | | |
|---|---|---|
| JP | 2003-168408 A | 6/2003 |
| JP | 2017-168183 A | 9/2017 |
| JP | 2020-173900 A | 10/2020 |
| WO | 2016/152024 A1 | 9/2016 |
| WO | 2018/087890 A1 | 5/2018 |
| WO | 2022/009396 A1 | 1/2022 |

OTHER PUBLICATIONS

Decision to Grant a Patent dated Mar. 19, 2024 issued in Japanese Patent Application No. 2023-578669, with English translation.

\* cited by examiner

POWER STORAGE PACK, SEMICONDUCTOR DEVICE, AND SEMICONDUCTOR DEVICE MANUFACTURING METHOD

CROSS REFERENCE TO RELATED APPLICATIONS

This is a continuation application of PCT International Application No. PCT/JP2023/025486 filed on Jul. 10, 2023, designating the United States of America, which is based on and claims priority of Japanese Patent Application No. 2022-205527 filed on Dec. 22, 2022. The entire disclosures of the above-identified applications, including the specifications, drawings and claims are incorporated herein by reference in their entirety.

FIELD

The present disclosure relates to a power storage pack, a semiconductor device for use in a power storage pack, and a method of manufacturing the semiconductor device.

BACKGROUND

Power storage packs including semiconductor devices have conventionally been known (see, for example, Patent Literature (PTL) 1).

CITATION LIST

Patent Literature

PTL 1: WO2022/009396

SUMMARY

Technical Problem

In general, a power storage pack includes a power storage cell and a protection circuit substrate on which semiconductor elements are mounted and which has a function to protect the power storage cell from overcharge or overdischarge.

Reduction in the size of a protection circuit substrate included in a power storage pack is demanded.

In view of this, the present disclosure has an object to provide a power storage pack and a semiconductor device that can achieve the reduction in the size of a protection circuit substrate, and a method of manufacturing the semiconductor device.

Solution to Problem

A power storage pack according to one aspect of the present disclosure includes: a power storage cell; a power storage tab connected to the power storage cell and serving as a conduction path for charging or discharging the power storage cell; a protection circuit substrate that protects the power storage cell from overcharge or overdischarge; a semiconductor element of chip-size package type that is face-down mounted on the protection circuit substrate; and a metal plate for power storage tab joint that is connected to the semiconductor element on the first main surface of the metal plate for power storage tab joint and includes a portion whose thickness is at most 0.2 mm. In the plan view of the protection circuit substrate: the metal plate for power storage tab joint is joined to the power storage tab on the second main surface of the metal plate for power storage tab joint to include an overlap portion in which the power storage tab, the metal plate for power storage tab joint, the semiconductor element, and the protection circuit substrate overlap each other, where the second main surface and the first main surface face in opposite directions; and there is a portion in which a region that may be the conduction path between the power storage tab and the protection circuit substrate overlaps the overlap portion.

A semiconductor device according to one aspect of the present disclosure includes: a semiconductor element of chip-size package type including a plurality of external connection terminals; and a first metal plate including a portion whose thickness is at most 0.2 mm. The semiconductor element includes one main surface to which the first metal plate is connected. The semiconductor element includes the other main surface that includes a substrate connection terminal to be connected to a mounting substrate on which the semiconductor element is mounted, where the other main surface and the one main surface face in opposite directions and the substrate connection terminal is included in the plurality of external connection terminals. The first metal plate includes a first main surface connected to the semiconductor element and a second main surface on which a joint preparation region for joining the first metal plate and a second metal plate is provided, where the second main surface and the first main surface face in opposite directions. In the plan view of the first metal plate, the joint preparation region does not overlap a connection region in which the first metal plate is connected to the semiconductor element. The first metal plate has the same electric potential as at least one of the plurality of external connection terminals. The first metal plate is bendable at the portion whose thickness is at most 0.2 mm to include a portion in which second main surfaces face each other.

A power storage pack according to one aspect of the present disclosure includes the semiconductor device, the second metal plate, the mounting substrate, and a power storage cell. The second metal plate is a power storage tab connected to the power storage cell and serves as a conduction path for charging or discharging the power storage cell. The first metal plate is a metal plate for power storage tab joint which is to be joined to the power storage tab. The mounting substrate is a protection circuit substrate that protects the power storage cell from overcharge or overdischarge. The conduction path is formed from the power storage cell in order of the power storage cell, the power storage tab, the metal plate for power storage tab joint, and the semiconductor element, or in reverse order.

A power storage pack according to one aspect of the present disclosure includes the semiconductor device, the second metal plate, the mounting substrate, and a power storage cell. The second metal plate is joined to the first metal plate in the joint preparation region. The second metal plate is a power storage tab connected to the power storage cell and serves as a conduction path for charging or discharging the power storage cell. The first metal plate is a metal plate for power storage tab joint which is to be joined to the power storage tab. The mounting substrate is a protection circuit substrate that protects the power storage cell from overcharge or overdischarge. A current path, along which current flows from the power storage cell in order of the power storage cell, the power storage tab, the metal plate for power storage tab joint, and the semiconductor element, or in reverse order, is formed. The semiconductor element is a switching element. The switching element controls the charging or discharging of the power storage cell in the protection circuit substrate.

A power storage pack according to one aspect of the present disclosure includes: a first semiconductor device and a second semiconductor device each of which is the semiconductor device; a fourth metal plate that is the second metal plate joined to the joint preparation region in the first semiconductor device; a fifth metal plate that is the second metal plate joined to the joint preparation region in the second semiconductor device; the mounting substrate on which a first semiconductor element that is the semiconductor element in the first semiconductor device and a second semiconductor element that s the semiconductor element in the second semiconductor device are mounted; and a power storage cell. The fourth metal plate is a first power storage tab connected to a positive electrode terminal of the power storage cell. The fifth metal plate is a second power storage tab connected to a negative electrode terminal of the power storage cell. The mounting substrate is a protection circuit substrate that protects the power storage cell from overcharge or overdischarge. The first metal plate in the first semiconductor device is a first metal plate for power storage tab joint to be joined to the first power storage tab. The first metal plate in the second semiconductor device is a second metal plate for power storage tab joint to be joined to the second power storage tab. The first semiconductor element is a first switching element. The second semiconductor element is a second switching element. A current path, along which current flows from the power storage cell in order of the power storage cell, the first power storage tab, the first metal plate for power storage tab joint, and the first semiconductor element, or in reverse order, is formed. A current path, along which current flows from the power storage cell in order of the power storage cell, the second power storage tab, the second metal plate for power storage tab joint, the second semiconductor element, or in reverse order, is formed. The first switching element and the second switching element control charging or discharging of the power storage cell in the protection circuit substrate. The substrate connection terminal in the first switching element comprises a plurality of substrate connection terminals. The substrate connection terminal in the second switching element comprises a plurality of substrate connection terminals. The power storage pack further includes: first wiring provided on the protection circuit substrate, having a same electric potential as the first power storage tab, and connected to a first substrate connection terminal that is one of the plurality of substrate connection terminals in the first switching element; second wiring provided on the protection circuit substrate and connected to one of the plurality of substrate connection terminals in the first switching element that exclude the first substrate connection terminal; a power storage pack positive electrode terminal connected to the second wiring; third wiring provided on the protection circuit substrate, having the same electric potential as the second power storage tab, and connected to a second substrate connection terminal that is one of the plurality of substrate connection terminals in the second switching element; fourth wiring provided on the protection circuit substrate and connected to one of the plurality of substrate connection terminals in the second switching element that exclude the second substrate connection terminal; and a power storage pack negative electrode terminal connected to the fourth wiring.

A power storage pack according to one aspect of the present disclosure includes: a first semiconductor device that is the semiconductor device; a fourth metal plate that is the second metal plate joined to the joint preparation region in the first semiconductor device; the mounting substrate on which a first semiconductor element that is the semiconductor element in the first semiconductor device is mounted; a second semiconductor element of chip-size package type that is face-down mounted on the mounting substrate; a power storage cell; a second power storage tab connected to a positive electrode terminal of the power storage cell; and a second metal plate for power storage tab joint that is connected to the second semiconductor element on a third main surface of the second metal plate, joined to the second power storage tab on a fourth main surface of the second metal plate, and including a portion whose thickness is at most 0.2 mm, where the fourth main surface and the third main surface face in opposite directions. The fourth metal plate is a first power storage tab connected to a negative electrode terminal of the power storage cell. The mounting substrate is a protection circuit substrate that protects the power storage cell from overcharge or overdischarge. The first metal plate in the first semiconductor device is a first metal plate for power storage tab joint to be joined to the first power storage tab. The first semiconductor element is a first switching element. The second semiconductor element is a second switching element. A current path, along which current flows from the power storage cell in order of the power storage cell, the first power storage tab, the first metal plate for power storage tab joint, and the first semiconductor element, or in reverse order, is formed. A current path, along which current flows from the power storage cell in order of the power storage cell, the second power storage tab, the second metal plate for power storage tab joint, and the protection circuit substrate, or in reverse order, is formed. In the plan view of the protection circuit substrate, there is an overlap portion in which the second power storage tab, the second metal plate for power storage tab joint, the second semiconductor element, and the protection circuit substrate overlap each other. In the plan view of the protection circuit substrate, there is a portion in which a region through which current flows between the second power storage tab and the protection circuit substrate overlaps the overlap portion. The second metal plate for power storage tab joint is bent to include a portion in which fourth main surfaces face each other. In the plan view of the second metal plate for power storage tab joint in a state before being bent, a region in which the second metal plate for power storage tab joint is joined to the second power storage tab does not overlap a region in which the second metal plate for power storage tab joint is connected to the second semiconductor element. The first switching element and the second switching element control charging or discharging the power storage cell in the protection circuit substrate. The substrate connection terminal in the first switching element comprises a plurality of substrate connection terminals. The power storage pack further includes: first wiring provided on the protection circuit substrate, having the same electric potential as the first power storage tab, and connected to a first substrate connection terminal that is one of the plurality of substrate connection terminals in the first switching element; second wiring provided on the protection circuit substrate and connected to one of the plurality of substrate connection terminals in the first switching element that exclude the first substrate connection terminal; third wiring provided on the protection circuit substrate and connected to the second wiring via the second switching element; a power storage pack negative electrode terminal connected to the third wiring; fourth wiring provided on the protection circuit substrate and having the same electric potential as the second power storage tab; and a power storage pack positive electrode terminal connected to the fourth wiring.

A semiconductor device manufacturing method according to one aspect of the present disclosure includes: a first process of connecting a semiconductor element to a first main surface of a first metal plate; a second process of mounting the semiconductor element on a mounting substrate after the first process; a third process of joining a second metal plate to a second main surface of the first metal plate after the second process, where the second main surface and the first main surface face in opposite directions; a fourth process of bending the first metal plate after the third process so that the first metal plate includes (1) a portion in which second main surfaces face each other and (2) a portion in which a region in which the first metal plate is connected to the semiconductor element overlaps a region in which the first metal plate is joined to the second metal plate with the first metal plate interposed therebetween; and a fifth process of bending the second metal plate after the third process so that the second metal plate includes a portion in which planes to be joined to the first metal plate face each other.

Advantageous Effects

According to the power storage pack, the semiconductor device, and the semiconductor device manufacturing method according to one aspect of the present disclosure, a battery pack and a semiconductor device that can achieve reduction in the size of a protection circuit substrate, and a method of manufacturing the semiconductor device are provided.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
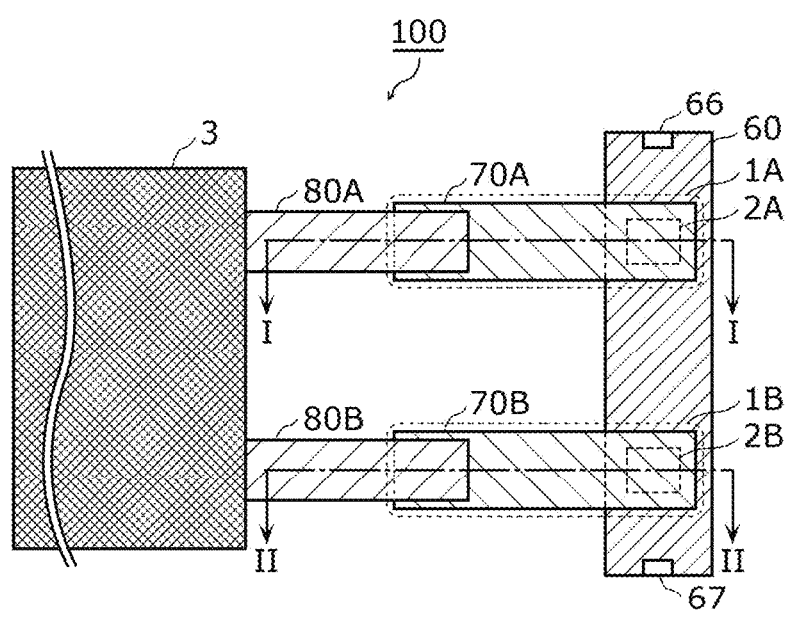
FIG. 1 is a plan view illustrating the configuration of a power storage pack according to Embodiment 1.

DESCRIPTION OF EMBODIMENTS (Circumstances Leading to One Aspect of the Present Disclosure)

The inventors are engaged in developing semiconductor devices for use in power storage packs. Through this development, the inventors have diligently repeated experiments and studies to achieve reduction in the size of a protection circuit substrate included in a power storage pack. As a result, the inventors have reached a power storage pack, a semiconductor device, and a semiconductor device manufacturing method according to one aspect of the present disclosure described below.

A power storage pack according to one aspect of the present disclosure includes: a power storage cell; a power storage tab connected to the power storage cell and serving as a conduction path for charging or discharging the power storage cell; a protection circuit substrate that protects the power storage cell from overcharge or overdischarge; a semiconductor element of chip-size package type that is face-down mounted on the protection circuit substrate; and a metal plate for power storage tab joint that is connected to the semiconductor element on the first main surface of the metal plate for power storage tab joint and includes a portion whose thickness is at most 0.2 mm. In the plan view of the protection circuit substrate: the metal plate for power storage tab joint is joined to the power storage tab on the second main surface of the metal plate for power storage tab joint to include an overlap portion in which the power storage tab, the metal plate for power storage tab joint, the semiconductor element, and the protection circuit substrate overlap each other, where the second main surface and the first main surface face in opposite directions; and there is a portion in which a region that may be the conduction path between the power storage tab and the protection circuit substrate overlaps the overlap portion.

In a conventional power storage pack, a power storage tab connected to a power storage cell is connected to a protection circuit substrate on which semiconductor elements are mounted.

In contrast, in the power storage pack according to one aspect of the present disclosure, a power storage tab connected to the power storage cell is joined to a metal plate for power storage tab joint connected to semiconductor elements mounted on the protection circuit substrate.

The power storage pack according to one aspect of the present disclosure therefore does not require a region for connecting the power storage tab in the protection circuit substrate, which is required in the conventional power storage pack.

Accordingly, with the power storage pack according to one aspect of the present disclosure, it is possible to achieve reduction in the size of a protection circuit substrate.

In the present description, the term "join" means a state of being physically in contact with another component to be connected thereto, either directly or indirectly, and means a state of not being freely attachable and detachable. In the present description, in addition to the definition of the term "join", the term "connect" means a state of being connected including a connection that is not physical (e.g., electrical).

The metal plate for power storage tab joint may be bent at the portion whose thickness is at most 0.2 mm to include a portion in which second main surfaces face each other with the power storage tab imposed therebetween. In the plan view of the metal plate for power storage tab joint in a state before being bent, a region in which the metal plate for power storage tab joint is joined to the power storage tab may not overlap a region in which the metal plate for power storage tab joint is connected to the semiconductor element.

In the power storage pack having the above-described configuration, in the plan view of the metal plate for power storage tab joint in a state before being bent, a region in which the metal plate for power storage tab joint is joined to the power storage tab and a region in which the metal plate for power storage tab joint is connected to the semiconductor element are distant from each other. This can therefore inhibit a negative influence to the semiconductor element due to heat or a physical impact generated when the metal plate for power storage tab joint is joined to the power storage tab.

In addition, since the metal plate for power storage tab joint is being bent, reduction in the size of the power storage pack itself can be achieved.

The semiconductor element may be a switching element, and the switching element may control charging or discharging of the power storage cell in the protection circuit substrate.

This can achieve, using a semiconductor element, a protective function to protect a power storage cell from overcharge or overdischarge.

A semiconductor device according to one aspect of the present disclosure includes: a semiconductor element of chip-size package type including a plurality of external connection terminals; and a first metal plate including a portion whose thickness is at most 0.2 mm. The semiconductor element includes one main surface to which the first metal plate is connected. The semiconductor element includes the other main surface that includes a substrate connection terminal to be connected to a mounting substrate on which the semiconductor element is mounted, where the other main surface and the one main surface face in opposite directions and the substrate connection terminal is included in the plurality of external connection terminals. The first metal plate includes a first main surface connected to the semiconductor element and a second main surface on which a joint preparation region for joining the first metal plate and a second metal plate is provided, where the second main surface and the first main surface face in opposite directions. In the plan view of the first metal plate, the joint preparation region does not overlap a connection region in which the first metal plate is connected to the semiconductor element. The first metal plate has the same electric potential as at least one of the plurality of external connection terminals. The first metal plate is bendable at the portion whose thickness is at most 0.2 mm to include a portion in which second main surfaces face each other.

As described above, in the conventional power storage pack, a power storage tab connected to the power storage cell is connected to the protection circuit substrate on which semiconductor elements are mounted.

In contrast, with the semiconductor device according to one aspect of the present disclosure, it is possible to achieve a power storage pack by this semiconductor element being mounted on the protection circuit substrate that serves as a mounting substrate, and also by a power storage tab, which serves as a second metal plate, being joined to the joint preparation region of a first metal plate.

In this power storage pack, the power storage tab connected to the power storage cell is joined to the metal plate for power storage tab joint connected to a semiconductor element mounted on the protection circuit substrate.

The semiconductor device according to one aspect of the present disclosure therefore does not require a region for connecting the power storage tab in the protection circuit substrate, which is required in the conventional power storage pack.

Accordingly, with the semiconductor device according to one aspect of the present disclosure, it is possible to achieve reduction in the size of a protection circuit substrate.

In addition, according to the semiconductor device according to one aspect of the present disclosure, since the joint preparation region and the connection region are distant from each other in the plan view of the first metal plate, it is possible to inhibit a negative influence to the semiconductor element due to heat or a physical impact generated when the first metal plate is joined to the power storage tab serving as the second metal plate.

In addition, owing to the power storage tab, which serves as the second metal plate, being joined to the first metal plate, heat can be dissipated using the power storage tab. The heat dissipation property of the semiconductor element can be therefore enhanced.

The semiconductor device may further include one or more metal components on the first main surface of the first metal plate, where the one or more metal components are to be mounted on the mounting substrate together with the semiconductor element when the semiconductor element is mounted on the mounting substrate. In the plan view of the first metal plate, each of regions in which the first main surface is connected to the one or more metal components may not overlap the joint preparation region.

Moreover, the first metal plate may be bendable at a bending axis at which thickness is at most 0.2 mm to include a portion in which the second main surfaces face each other, and the joint preparation region and the connection region may be located on one side and the other side of the bending axis in the plan view of the first metal plate.

Moreover, the first metal plate may be bendable at a bending axis in the portion whose thickness is at most 0.2 mm to include a portion in which the second main surfaces face each other. In the plan view of the semiconductor element, the semiconductor element may be a rectangle having a first side and may be connected to the first metal plate in a direction in which the first side is perpendicular to the bending axis. In the plan view of the first metal plate, the length of the first metal plate in the direction perpendicular to the bending axis may be at least two times the length of the first side in the plan view of the semiconductor element.

Moreover, the first metal plate may be bendable at a bending axis in the portion whose thickness is at most 0.2 mm to include a portion in which the second main surfaces face each other. In the plan view of the first metal plate, the first metal plate is approximately a rectangle having a first approximately-straight side and a second approximately-straight side that are approximately straight and extending in the direction perpendicular to the bending axis. Each of the first approximately-straight side and the second approximately-straight side may include a recess that is an inwardly recessed portion of the first metal plate in the plan view of the first metal plate.

This makes it relatively easy to bend the first metal plate at a recess.

Moreover, the one or more metal components may include the same material as the first metal plate, and the one or more metal components and the first metal plate may be integrated.

Moreover, the semiconductor device may further include a third metal plate between the semiconductor element and the first metal plate. The third metal plate may be connected to the semiconductor element on the one main surface of the semiconductor element and may be connected to the first metal plate on the first main surface of the first metal plate. The first metal plate may be connected to the one main surface of the semiconductor element via the third metal plate.

Moreover, the semiconductor device may further include one or more metal components on a main surface, of the third metal plate, on which the third metal plate is connected to the semiconductor element, where the one or more metal components are to be mounted on the mounting substrate together with the semiconductor element when the semiconductor element is mounted on the mounting substrate. In the plan view of the first metal plate, each of regions, in which the main surface is connected to the one or more metal components, does not overlap the joint preparation region.

Moreover, the first metal plate is bent to include the portion in which the second main surfaces face each other. In the plan view of the semiconductor element, there may be a portion in which the semiconductor element overlaps the joint preparation region with the first metal plate interposed therebetween.

With this, owing to the first metal plate being bent, reduction in the size of a semiconductor device can be achieved.

Moreover, the semiconductor element may be face-down mounted on the mounting substrate via the substrate connection terminal, and the first metal plate may be joined to the second metal plate in the joint preparation region.

Moreover, the semiconductor element may be face-down mounted on the mounting substrate via the substrate connection terminal. The first metal plate may be joined to the second metal plate in the joint preparation region. The second metal plate may be bent to include a portion in which planes to be joined to the first metal plate face each other with the first metal plate interposed therebetween. In the plan view of the mounting substrate, there may be an overlap portion in which the second metal plate, the first metal plate, the semiconductor element, and the mounting substrate overlap each other. In the plan view of the mounting substrate, there may be a portion in which a region through which current flows between the second metal plate and the mounting substrate overlaps the overlap portion.

A power storage pack according to one aspect of the present disclosure includes the semiconductor device, the second metal plate, the mounting substrate, and a power storage cell. The second metal plate is a power storage tab connected to the power storage cell and serves as a conduction path for charging or discharging the power storage cell. The first metal plate is a metal plate for power storage tab joint which is to be joined to the power storage tab. The mounting substrate is a protection circuit substrate that protects the power storage cell from overcharge or overdischarge. The conduction path is formed from the power storage cell in order of the power storage cell, the power storage tab, the metal plate for power storage tab joint, and the semiconductor element, or in reverse order.

As described above, in the conventional power storage pack, a power storage tab connected to the power storage cell is connected to the protection circuit substrate on which semiconductor elements are mounted.

In contrast, in the power storage pack according to one aspect of the present disclosure, a power storage tab connected to the power storage cell is joined to a metal plate for power storage tab joint connected to a semiconductor element mounted on the protection circuit substrate.

The power storage pack according to one aspect of the present disclosure therefore does not require a region for connecting the power storage tab in the protection circuit substrate, which is required in the conventional power storage pack.

Accordingly, with the power storage pack according to one aspect of the present disclosure, it is possible to achieve reduction in the size of a protection circuit substrate.

Moreover, the one or more metal components may be connected to the protection circuit substrate.

Moreover, in the plan view of the semiconductor element, the semiconductor element may be rectangular in shape and include two sides that are parallel to the longitudinal direction of the protection circuit substrate. The one or more metal components may include two metal components disposed to face each other at the full length of at least the two sides along the two sides.

This disperses part of stress imposed on a semiconductor element to two metal components. The semiconductor element therefore becomes less likely to peel off from the protection circuit substrate. In addition, pressure tolerance against pressure imposed on one main surface of the semiconductor element from the second main surface side of the first metal plate can be enhanced.

Moreover, in the plan view of the semiconductor element, the semiconductor element may be rectangular in shape and include two sides that are perpendicular to the longitudinal direction of the protection circuit substrate. The one or more metal components may include two metal components disposed to face each other at the full length of at least the two sides along the two sides.

This disperses part of stress imposed on a semiconductor element to two metal components. The semiconductor element therefore becomes less likely to peel off from the protection circuit substrate. In addition, pressure tolerance against pressure imposed on one main surface of the semiconductor element from the second main surface side of the first metal plate can be enhanced.

Moreover, in the plan view of the semiconductor element, the semiconductor element may be rectangular in shape, and the one or more metal components may include four metal components each disposed in the vicinity of a different one of four corners of the semiconductor element.

This disperses part of stress imposed on a semiconductor element to four metal components. The semiconductor element therefore becomes less likely to peel off from the protection circuit substrate. In addition, pressure tolerance against pressure imposed on one main surface of the semiconductor element from the second main surface side of the first metal plate can be enhanced.

Moreover, the semiconductor element may be a switching element, and the switching element may control the charging or discharging of the power storage cell in the protection circuit substrate.

This can achieve a protective function to protect the power storage cell from overcharge or overdischarge using a semiconductor element.

Moreover, in the plan view of the switching element, the switching element may include, on the other main surface side, a plurality of regions that divide the switching element and include a first region and a second region adjacent to each other. The switching element may further include: a first vertical MOS transistor in the first region; and a second vertical MOS transistor in the second region. The substrate connection terminal may include a plurality of substrate connection terminals. On the other main surface of the switching element, the first vertical MOS transistor may include: a first source terminal that is the substrate connection terminal; and a first gate terminal that is the substrate connection terminal and controls a conduction state of the first vertical MOS transistor. On the other main surface of the switching element, the second vertical MOS transistor may include: a second source terminal that is the substrate connection terminal; and a second gate terminal that is the substrate connection terminal and controls a conduction state of the second vertical MOS transistor. On the one main surface of the switching element, the switching element may further include a drain electrode shared between the first vertical MOS transistor and the second vertical MOS transistor. The drain electrode may be connected to the metal plate for power storage tab joint via a dielectric adhesive component. At least one of the one or more metal components may be connected only to the first source terminal among the plurality of substrate connection terminals via wiring on the protection circuit substrate.

With this, it is possible, using a semiconductor element, to achieve the protective function of the power storage cell against (i) charging or discharging of the power storage cell of current that flows in the direction from the power storage tab to the protection circuit substrate, and (ii) charging or discharging of the power storage cell of current that flows in the direction from the protection circuit substrate to the power storage tab.

Moreover, the substrate connection terminal may comprise a plurality of substrate connection terminals. The switching element may be a vertical MOS transistor that (i) includes, on the other main surface of the switching element, a source terminal and a gate terminal each of which is the substrate connection terminal, and (ii) includes, on the one main surface of the switching element, a drain electrode that is one of the plurality of external connection terminals. The drain electrode may be connected to the metal plate for power storage tab joint via a conductive adhesive component.

With this, it is possible, using a semiconductor element, to achieve the protective function of the power storage cell against (i) charging or discharging of the power storage cell of current that flows in the direction from the power storage tab to the protection circuit substrate, and (ii) charging or discharging of the power storage cell of current that flows in the direction from the protection circuit substrate to the power storage tab.

A power storage pack according to one aspect of the present disclosure includes the semiconductor device, the second metal plate, the mounting substrate, and a power storage cell. The second metal plate is joined to the first metal plate in the joint preparation region. The second metal plate is a power storage tab connected to the power storage cell and serves as a conduction path for charging or discharging the power storage cell. The first metal plate is a metal plate for power storage tab joint which is to be joined to the power storage tab. The mounting substrate is a protection circuit substrate that protects the power storage cell from overcharge or overdischarge. A current path, along which current flows from the power storage cell in order of the power storage cell, the power storage tab, the metal plate for power storage tab joint, and the semiconductor element, or in reverse order, is formed. The semiconductor element is a switching element, and the switching element controls the charging or discharging of the power storage cell in the protection circuit substrate.

As described above, in the conventional power storage pack, a power storage tab connected to the power storage cell is connected to the protection circuit substrate on which semiconductor elements are mounted.

In contrast, in the power storage pack according to one aspect of the present disclosure, a power storage tab connected to the power storage cell is joined to a metal plate for power storage tab joint connected to a semiconductor element mounted on the protection circuit substrate.

The power storage pack according to one aspect of the present disclosure therefore does not require a region for connecting the power storage tab in the protection circuit substrate, which is required in the conventional power storage pack.

Accordingly, with the power storage pack according to one aspect of the present disclosure, it is possible to achieve reduction in the size of a protection circuit substrate.

In addition, with the power storage pack according to one aspect of the present disclosure, it is possible to achieve, using a semiconductor element, the protective function of the power storage cell.

A power storage pack according to one aspect of the present disclosure includes: a first semiconductor device and a second semiconductor device each of which is the semiconductor device; a fourth metal plate that is the second metal plate joined to the joint preparation region in the first semiconductor device; a fifth metal plate that is the second metal plate joined to the joint preparation region in the second semiconductor device; the mounting substrate on which a first semiconductor element that is the semiconductor element in the first semiconductor device and a second semiconductor element that s the semiconductor element in the second semiconductor device are mounted; and a power storage cell. The fourth metal plate is a first power storage tab connected to a positive electrode terminal of the power storage cell. The fifth metal plate is a second power storage tab connected to a negative electrode terminal of the power storage cell. The mounting substrate is a protection circuit substrate that protects the power storage cell from overcharge or overdischarge. The first metal plate in the first semiconductor device is a first metal plate for power storage tab joint to be joined to the first power storage tab. The first metal plate in the second semiconductor device is a second metal plate for power storage tab joint to be joined to the second power storage tab. The first semiconductor element is a first switching element. The second semiconductor element is a second switching element. A current path, along which current flows from the power storage cell in order of the power storage cell, the first power storage tab, the first metal plate for power storage tab joint, and the first semiconductor element, or in reverse order, is formed. A current path, along which current flows from the power storage cell in order of the power storage cell, the second power storage tab, the second metal plate for power storage tab joint, the second semiconductor element, or in reverse order, is formed. The first switching element and the second switching element control charging or discharging of the power storage cell in the protection circuit substrate. The substrate connection terminal in the first switching element comprises a plurality of substrate connection terminals. The substrate connection terminal in the second switching element comprises a plurality of substrate connection terminals. The power storage pack further includes: first wiring provided on the protection circuit substrate, having the same electric potential as the first power storage tab, and connected to a first substrate connection terminal that is one of the plurality of substrate connection terminals in the first switching element; second wiring provided on the protection circuit substrate and connected to one of the plurality of substrate connection terminals in the first switching element that exclude the first substrate connection terminal; a power storage pack positive electrode terminal connected to the second wiring; third wiring provided on the protection circuit substrate, having the same electric potential as the second power storage tab, and connected to a second substrate connection terminal that is one of the plurality of substrate connection terminals in the second switching element; fourth wiring provided on the protection circuit substrate and connected to one of the plurality of substrate connection terminals in the second switching element that exclude the second substrate connection terminal; and a power storage pack negative electrode terminal connected to the fourth wiring.

In the conventional power storage pack, each of the first power storage tab connected to the positive electrode terminal of the power storage cell and the second power storage tab connected to the negative electrode terminal of the power storage cell is connected to the protection circuit substrate on which the first semiconductor element and the second semiconductor element are mounted.

In contrast, in the power storage pack according to one aspect of the present disclosure, the first power storage tab connected to the positive electrode terminal of the power storage cell is joined to the first metal plate for power storage tab joint connected to the first semiconductor element mounted on the protection circuit substrate, while the second power storage tab connected to the negative electrode terminal of the power storage cell is joined to the second metal plate for power storage tab joint connected to the second semiconductor element mounted on the protection circuit substrate.

The power storage pack according to one aspect of the present disclosure therefore neither requires, in the protection circuit substrate, a region for connecting the first power storage tab nor a region for connecting the second power storage tab, which are required in the conventional power storage pack.

Accordingly, with the power storage pack according to one aspect of the present disclosure, it is possible to achieve reduction in the size of a protection circuit substrate.

In addition, with the power storage pack according to one aspect of the present disclosure, it is possible, using the first semiconductor element and the second semiconductor element, to achieve the double protection function of the power storage cell that uses each of the current path on the high side of the power storage cell and the current path on the low side of the power storage cell.

A power storage pack according to one aspect of the present disclosure includes: a first semiconductor device that is the semiconductor device; a fourth metal plate that is the second metal plate joined to the joint preparation region in the first semiconductor device; the mounting substrate on which a first semiconductor element that is the semiconductor element in the first semiconductor device is mounted; a second semiconductor element of chip-size package type that is face-down mounted on the mounting substrate; a power storage cell; a second power storage tab connected to a positive electrode terminal of the power storage cell; and a second metal plate for power storage tab joint that is connected to the second semiconductor element on a third main surface of the second metal plate, joined to the second power storage tab on a fourth main surface of the second metal plate, and including a portion whose thickness is at most 0.2 mm, where the fourth main surface and the third main surface face in opposite directions. The fourth metal plate is a first power storage tab connected to a negative electrode terminal of the power storage cell. The mounting substrate is a protection circuit substrate that protects the power storage cell from overcharge or overdischarge. The first metal plate in the first semiconductor device is a first metal plate for power storage tab joint to be joined to the first power storage tab. The first semiconductor element is a first switching element. The second semiconductor element is a second switching element. A current path, along which current flows from the power storage cell in order of the power storage cell, the first power storage tab, the first metal plate for power storage tab joint, and the first semiconductor element, or in reverse order, is formed. A current path, along which current flows from the power storage cell in order of the power storage cell, the second power storage tab, the second metal plate for power storage tab joint, and the protection circuit substrate, or in reverse order, is formed. In a plan view of the protection circuit substrate, there is an overlap portion in which the second power storage tab, the second metal plate for power storage tab joint, the second semiconductor element, and the protection circuit substrate overlap each other. In the plan view of the protection circuit substrate, there is a portion in which a region through which current flows between the second power storage tab and the protection circuit substrate overlaps the overlap portion. The second metal plate for power storage tab joint is bent to include a portion in which fourth main surfaces face each other. In the plan view of the second metal plate for power storage tab joint in a state before being bent, a region in which the second metal plate for power storage tab joint is joined to the second power storage tab does not overlap a region in which the second metal plate for power storage tab joint is connected to the second semiconductor element. The first switching element and the second switching element control charging or discharging the power storage cell in the protection circuit substrate. The substrate connection terminal in the first switching element comprises a plurality of substrate connection terminals. The power storage pack further includes: first wiring provided on the protection circuit substrate, having the same electric potential as the first power storage tab, and connected to a first substrate connection terminal that is one of the plurality of substrate connection terminals in the first switching element; second wiring provided on the protection circuit substrate and connected to one of the plurality of substrate connection terminals in the first switching element that exclude the first substrate connection terminal; third wiring provided on the protection circuit substrate and connected to the second wiring via the second switching element; a power storage pack negative electrode terminal connected to the third wiring; fourth wiring provided on the protection circuit substrate and having the same electric potential as the second power storage tab; and a power storage pack positive electrode terminal connected to the fourth wiring.

In the conventional power storage pack, each of the first power storage tab connected to the positive electrode terminal of the power storage cell and the second power storage tab connected to the negative electrode terminal of the power storage cell is connected to the protection circuit substrate on which the first semiconductor element and the second semiconductor element are mounted.

In contrast, with the power storage pack according to one aspect of the present disclosure, the first power storage tab connected to the positive electrode terminal of the power storage cell is joined to the first metal plate for power storage tab joint connected to the first semiconductor element mounted on the protection circuit substrate, while the second power storage tab connected to the negative electrode terminal of the power storage cell is joined to the second metal plate for power storage tab joint connected to the second semiconductor element mounted on the protection circuit substrate.

The power storage pack according to one aspect of the present disclosure therefore neither requires, in the protection circuit substrate, a region for connecting the first power storage tab nor a region for connecting the second power storage tab which are required in the conventional power storage pack.

Accordingly, with the power storage pack according to one aspect of the present disclosure, it is possible to achieve reduction in the size of a protection circuit substrate.

In addition, with the power storage pack according to one aspect of the present disclosure, it is possible, using the first semiconductor element and the second semiconductor element, to achieve the double protection function of the power storage cell that uses only the current path on the low side of the power storage cell.

A semiconductor device manufacturing method according to one aspect of the present disclosure includes: a first process of connecting a semiconductor element to a first main surface of a first metal plate; a second process of mounting the semiconductor element on a mounting substrate after the first process; a third process of joining a second metal plate to a second main surface of the first metal plate after the second process, where the second main surface and the first main surface face in opposite directions; a fourth process of bending the first metal plate after the third process so that the first metal plate includes (1) a portion in which second main surfaces face each other and (2) a portion in which a region in which the first metal plate is connected to the semiconductor element overlaps a region in which the first metal plate is joined to the second metal plate with the first metal plate interposed therebetween in a plan view of the semiconductor element; and a fifth process of bending the second metal plate after the third process so that the second metal plate includes a portion in which planes to be joined to the first metal plate face each other.

As described above, in the conventional power storage pack, a power storage tab connected to the power storage cell is connected to the protection circuit substrate on which semiconductor elements are mounted.

In contrast, with the semiconductor device manufacturing method according to one aspect of the present disclosure, it is possible to achieve a power storage pack by this semiconductor element being mounted on the protection circuit substrate that serves as a mounting substrate and also by the power storage tab, which serves as the second metal plate, being connected to the second main surface of the semiconductor element.

In this power storage pack, a power storage tab connected to the power storage cell is joined to a metal plate for power storage tab joint connected to a semiconductor element mounted on the protection circuit substrate.

The semiconductor device manufacturing method according to one aspect of the present disclosure does not require a region for connecting the power storage tab in the protection circuit substrate, which is required in the conventional power storage pack.

Accordingly, with the semiconductor device manufacturing method according to one aspect of the present disclosure, it is possible to achieve reduction in the size of a protection circuit substrate.

Moreover, the semiconductor device manufacturing method may further include a sixth process of connecting a third metal plate including one or more metal components to the semiconductor element before the first process. In the first process, the semiconductor element may be connected to the first main surface of the first metal plate via the third metal plate.

Hereinafter, specific examples of the power storage pack, semiconductor device, and semiconductor device manufacturing method according to one aspect of the present disclosure will be described with reference to the drawings. Each of embodiments described below is one specific example of the present disclosure. Accordingly, numerical values, shapes, elements, arrangement and connection of the elements, as well as steps (processes) and orders of steps, etc. indicated in the following embodiments are merely examples, and do not intend to limit the present disclosure. The figures are schematic diagrams and are not necessarily precise illustrations. In the figures, elements that are essentially the same share like reference signs, and duplicate description is omitted or simplified.

Embodiment 1

(Configuration)

Hereinafter, the configuration of a power storage pack according to Embodiment 1 will be described.

Figure 2A:
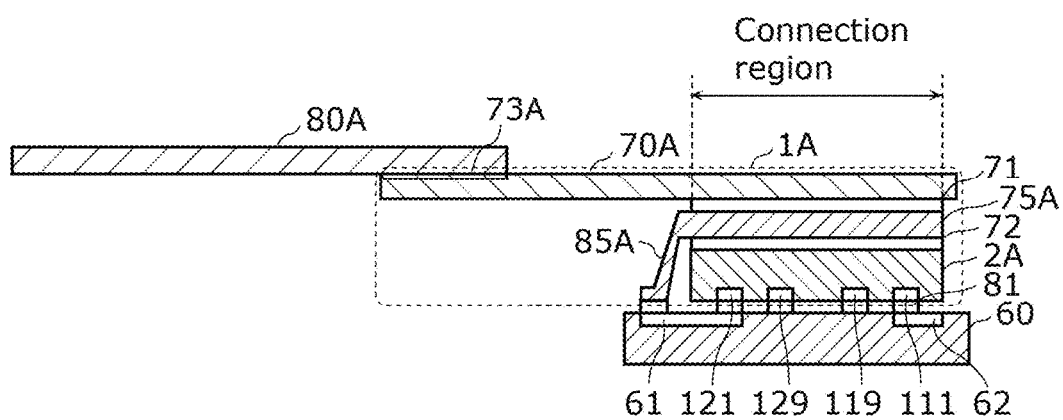
FIG. 2A is a cross-sectional view illustrating the configuration of the power storage pack according to Embodiment 1.
Figure 2B:
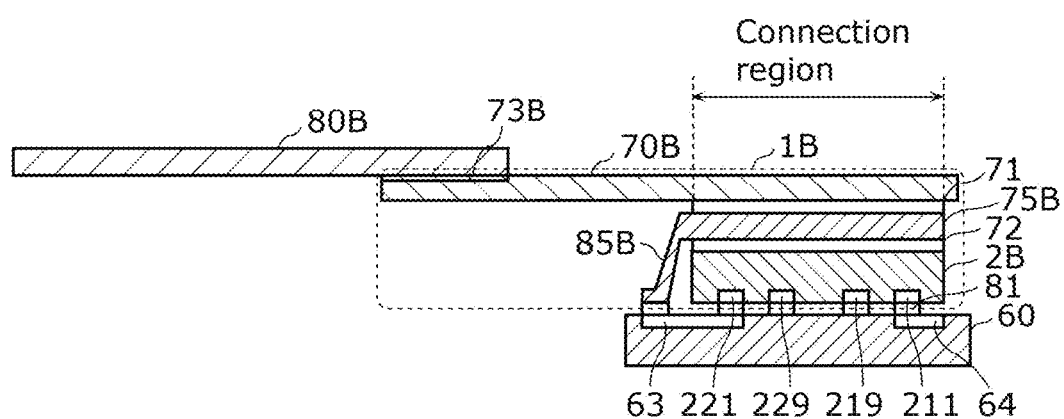
FIG. 2B is a cross-sectional view illustrating the configuration of the power storage pack according to Embodiment 1.

FIG. 1 is a plan view illustrating the configuration of power storage pack 100 according to Embodiment 1. FIG. 2A is a cross-sectional view illustrating a cross section taken at line I-I in FIG. 1. FIG. 2B is a cross-sectional view illustrating a cross section taken at line II-II in FIG. 1. FIG. 1 illustrates, using dotted lines, a part of a portion that cannot actually be directly seen, as if the part of the portion can be seen.

As illustrated in FIG. 1, FIG. 2A, and FIG. 2B, power storage pack 100 includes power storage cell 3, first power storage tab 80A, second power storage tab 80B, first semiconductor device 1A, second semiconductor device 1B, and protection circuit substrate 60. In the present description, first power storage tab 80A is also referred to as second metal plate 80A, second power storage tab 80B is also referred to as second metal plate 80B, and protection circuit substrate 60 is also referred to as mounting substrate 60.

Power storage cell 3 includes positive electrode terminal 36 (not shown in FIG. 1, FIG. 2A, and FIG. 2B, see FIG. 12 that is to be described later) and negative electrode terminal 37 (not shown in FIG. 1, FIG. 2A, and FIG. 2B, see FIG. 12 that is to be described later), and stores electric energy between positive electrode terminal 36 and negative electrode terminal 37. Power storage cell 3 can charge and discharge via positive electrode terminal 36 and negative electrode terminal 37. Power storage cell 3 may be, for example, a rechargeable battery represented by, for instance, a lithium-ion battery or a capacitor represented by, for instance, a lithium-ion capacitor. Hereinafter, power storage cell 3 will be described as being a rechargeable battery represented by, for instance, a lithium-ion battery.

First power storage tab 80A is a metal plate connected to positive electrode terminal 36 of power storage cell 3. First power storage tab 80A includes a metal material such as aluminum, as one non-limiting example.

Second power storage tab 80B is a metal plate connected to negative electrode terminal 37 of power storage cell 3. Second power storage tab 80B includes a metal material such as a nickel-plated metal material including copper, as one non-limiting example.

First power storage tab 80A and second power storage tab 80B form a part of a conduction path for charging or discharging power storage cell 3.

First semiconductor device 1A includes first semiconductor element 2A, first metal plate for power storage tab joint 70A, third metal plate 75A, and one or more metal components 85A. In the present description, first metal plate for power storage tab joint 70A is also referred to as first metal plate 70A.

First semiconductor element 2A is a chip-size package type semiconductor device including a plurality of external connection terminals (corresponding to first gate terminal 119, first source terminal 111, second gate terminal 129, second source terminal 121, and drain electrode 30 that are to be described later (shown in neither FIG. 1 nor FIG. 2A, see FIG. 3 and FIG. 4, for example)). First semiconductor element 2A is face-down mounted on protection circuit substrate 60 via a plurality of substrate connection terminals (corresponding to first gate terminal 119, first source terminal 111, second gate terminal 129, and second source terminal 121) among the plurality of external connection terminals. In the present description, drain electrode 30 is also referred to as metal layer 30.

First semiconductor element 2A is a semiconductor device in which one or more vertical metal oxide semiconductor (MOS) transistors are formed. Hereinafter, first semiconductor element 2A will be described, for example, as a semiconductor device in which two vertical MOS transistors are formed, but as long as first semiconductor element 2A is a semiconductor device in which at least one vertical MOS transistor is formed, first semiconductor element 2A does not necessarily need to be limited to a semiconductor device in which two vertical MOS transistors are formed.

Figure 3:
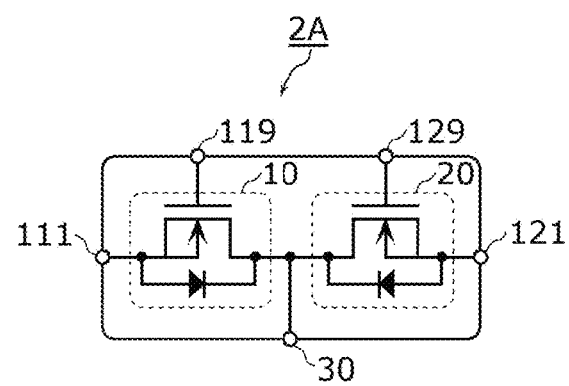
FIG. 3 is a circuit diagram of a first semiconductor element according to Embodiment 1.

FIG. 3 is the circuit diagram of first semiconductor element 2A.

As illustrated in FIG. 3, first semiconductor element 2A includes first vertical MOS transistor 10 and second vertical MOS transistor 20. Moreover, first semiconductor element 2A includes, as the plurality of external connection terminals, first gate terminal 119, one or more first source terminals 111, second gate terminal 129, one or more second source terminals 121, and drain electrode 30.

Figure 4:
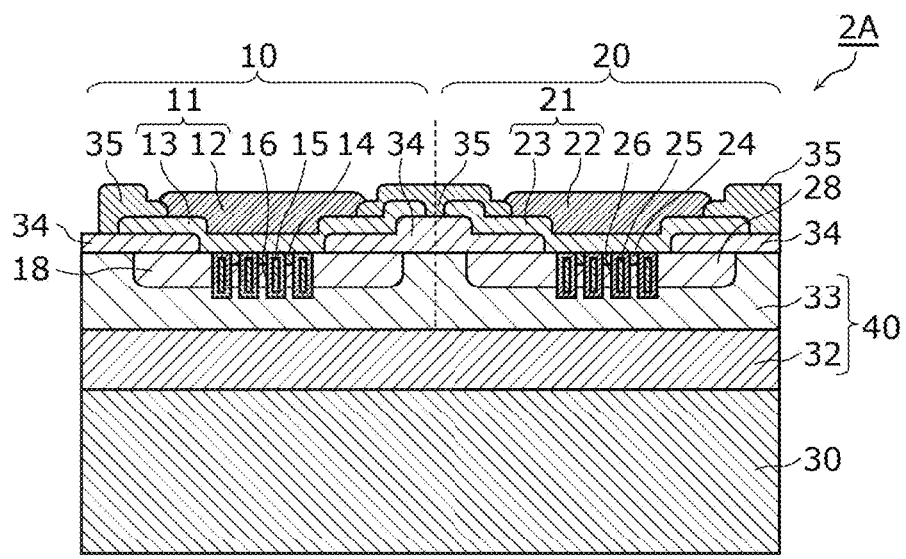
FIG. 4 is a cross-sectional view illustrating one example of the structure of the first semiconductor element according to Embodiment 1.
Figure 5:
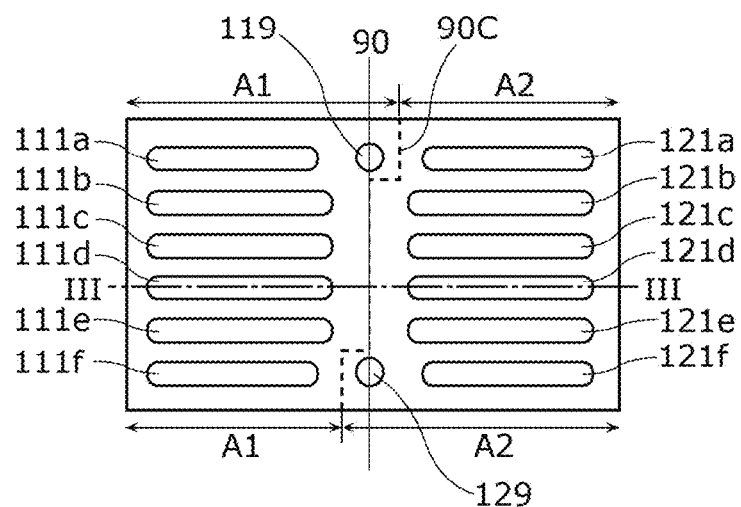
FIG. 5 is a plan view illustrating one example of the structure of the first semiconductor element according to Embodiment 1.

FIG. 4 is a cross-sectional view illustrating one example of the structure of first semiconductor element 2A. FIG. 5 is a plan view illustrating one example of the structure of first semiconductor element 2A. FIG. 4 illustrates a cross section taken at line III-III in FIG. 5.

As illustrated in FIG. 4 and FIG. 5, first semiconductor element 2A includes semiconductor layer 40, metal layer 30, first vertical MOS transistor 10 formed in first region A1 in semiconductor layer 40, and second vertical MOS transistor 20 formed in second region A2 in semiconductor layer 40. As illustrated in FIG. 4, first region A1 and second region A2 are adjacent to each other in the plan view of semiconductor layer 40.

Semiconductor layer 40 is composed by stacking semiconductor substrate 32 and low-concentration impurity layer 33.

Semiconductor substrate 32 is disposed on the bottom surface side of semiconductor layer 40 and includes silicon containing an impurity of a first conductivity type.

Low-concentration impurity layer 33 is disposed on the top surface side of semiconductor layer 40, formed in contact with semiconductor substrate 32, and contains an impurity of the first conductivity type whose concentration is lower than the concentration of the impurity of the first conductivity type in semiconductor substrate 32. Low-concentration impurity layer 33 may be formed on semiconductor substrate 32 by, for example, epitaxial growth.

Oxide film 34 is stacked on the top surface of semiconductor layer 40 and formed in contact with low-concentration impurity layer 33.

Protection layer 35 is formed in contact with the top surface of portion 13 (to be described later) of first source electrode 11 (to be described later), the top surface of portion 23 (to be described later) of second source electrode 21 (to be described later), and the top surface of oxide film 34, and covers at least a portion of the top surface of semiconductor layer 40 and a portion of the top surface of oxide film 34.

Metal layer 30 is formed in contact with the entire bottom surface of semiconductor substrate 32. Metal layer 30 may include a trace amount of an element other than a metal that gets mixed as an impurity in the process of manufacturing a metal material. Metal layer 30 functions as the common drain electrode of first vertical MOS transistor 10 and second vertical MOS transistor 20.

As illustrated in FIG. 4 and FIG. 5, first vertical MOS transistor 10 includes, on the top surface of semiconductor layer 40, first gate terminal 119 and one or more (six in this case) first source terminals 111 (first source terminals 111a, 111b, 111c, 111d, 111e, and 111f in this case) joined to mounting substrate 60 via conductive material 81 (e.g., solder, see FIG. 2A) during face-down mounting. Second vertical MOS transistor 20 includes, on the top surface of semiconductor layer 40, second gate terminal 129 and one or more (six in this case) second source terminals 121 (second source terminals 121a, 121b, 121c, 121d, 121e, and 121f in this case) joined to mounting substrate 60 via conductive material 81 during face-down mounting.

As illustrated in FIG. 4 and FIG. 5, semiconductor layer 40 is of a rectangular shape in plan view.

In FIG. 5, in the plan view of semiconductor layer 40, center line 90 is a line that bisects, in the first direction, semiconductor layer 40 that is rectangular.

Boundary 90C is a boundary between first region A1 and second region A2. In the plan view of semiconductor layer 40, boundary 90C bisects the area of semiconductor layer 40 but does not necessarily need to be one straight line. In the plan view of semiconductor layer 40, center line 90 and boundary 90C may or may not match.

The number of first gate terminals 119 and the number of second gate terminals 129 are not necessarily limited to one as illustrated in FIG. 5.

The number of one or more first source terminals 111 and the number of one or more second source terminals 121 are not necessarily limited to six as illustrated in FIG. 5, and may be at least one that is other than six.

As illustrated in FIG. 4 and FIG. 5, first body region 18 containing an impurity of a second conductivity type different from the first conductivity type is formed in first region A1 of low-concentration impurity layer 33. In first body region 18, first source region 14 containing the impurity of the first conductivity type, first gate conductor 15, and first gate insulating film 16 are formed. First source electrode 11 is composed of portion 12 and portion 13, and portion 12 is connected to first source region 14 and first body region 18 via portion 13. First gate conductor 15 is electrically connected to first gate terminal 119.

Portion 12 of first source electrode 11 is a layer joined to conductive material 81 in a reflow process during face-down mounting, and may contain a metal material including at least one of nickel, titan, tungsten, and paradium, as one non-limiting example. Gold or the like may be plated on the top surface of portion 12.

Portion 13 of first source electrode 11 is a layer that connects portion 12 and semiconductor layer 40, and may contain a metal material including at least one of aluminum, copper, gold, and silver, as one non-limiting example.

Second body region 28 containing the impurity of the second conductivity type is formed in second region A2 of low-concentration impurity layer 33. In second body region 28, second source region 24 containing the impurity of the first conductivity type, second gate conductor 25, and second gate insulating film 26 are formed. Second source electrode 21 is composed of portion 22 and portion 23, and portion 22 is connected to second source region 24 and second body region 28 via portion 23. Second gate conductor 25 is electrically connected to second gate terminal 129.

Portion 22 of second source electrode 21 is a layer joined to conductive material 81 in a reflow process during face-down mounting, and may contain a metal material including at least one of nickel, titan, tungsten, and paradium, as one non-limiting example. Gold or the like may be plated on the top surface of portion 22.

Portion 23 of second source electrode 21 is a layer that connects portion 22 and semiconductor layer 40, and may contain a metal material including at least one of aluminum, copper, gold, and silver, as one non-limiting example.

Owing to the above-described configuration of first vertical MOS transistor 10 and second vertical MOS transistor 20, low-concentration impurity layer 33 and semiconductor substrate 32 function as a common drain region sharing the first drain region of first vertical MOS transistor 10 and the second drain region of second vertical MOS transistor 20.

As illustrated in FIG. 4, first body region 18 is covered by oxide film 34 having an opening, and portion 13 of first source electrode 11 connected to first source region 14 is provided through the opening of oxide film 34. Oxide film 34 and portion 13 of first source electrode 11 are covered by protection layer 35 having an opening, and portion 12 connected to portion 13 of first source electrode 11 is provided through the opening of protection layer 35.

Second body region 28 is covered by oxide film 34 having an aperture, and portion 23 of second source electrode 21 connected to second source region 24 is provided through the aperture of oxide film 34. Oxide film 34 and portion 23 of second source electrode 21 are covered by protection layer 35 having an aperture, and portion 22 connected to portion 23 of second source electrode 21 is provided through the aperture of protection layer 35.

Accordingly, one or more first source terminals 111 and one or more second source terminals 121 are regions, so-called terminal portions, in which first source electrodes 11 and second source electrodes 21 are partly exposed on the top surface of first semiconductor element 2A. Likewise, first gate terminal 119 and second gate terminal 129 are regions, so-called terminal portions, in which a first gate electrode (not shown in the figure) and a second gate electrode (not shown in the figure) are partly exposed on the top surface of first semiconductor element 2A.

In this way, first vertical MOS transistor 10 includes, on the other main surface of first semiconductor element 2A, first source terminals 111 and first gate terminal 119 that controls the conduction state of first vertical MOS transistor 10. Second vertical MOS transistor 20 includes, on the other main surface of first semiconductor element 2A, second source terminals 121 and second gate terminal 129 that controls the conduction state of second vertical MOS transistor 20. First semiconductor element 2A includes, on one main surface of first semiconductor element 2A, drain electrode 30 shared between first vertical MOS transistor 10 and second vertical MOS transistor 20.

Returning back to FIG. 1 and FIG. 2A, the description of first semiconductor device 1A continues.

First metal plate 70A has a portion whose thickness is at most 0.2 mm and is connected to one main surface of first semiconductor element 2A on the first main surface. The one main surface is a main surface, out of two main surfaces of first semiconductor element 2A, in which drain electrode 30, i.e., metal layer 30 is formed.

More specifically, first metal plate 70A is connected to first semiconductor element 2A with third metal plate 75A, which is to be described later, interposed between first metal plate 70A and first semiconductor element 2A.

First metal plate 70A is connected to third metal plate 75A via conductive material 71 (e.g., solder), and third metal plate 75A is connected to the one main surface of first semiconductor element 2A via insulating material 72 (e.g., an insulating adhesive). Third metal plate 75A is therefore insulated from drain electrode 30.

First metal plate 70A contains a metal material including any one of aluminum, copper, and silver, as one non-limiting example.

The thickness of first metal plate 70A needs to be at most 0.2 mm in at least a portion. For example, only the portion of bending axis 74, which is to be described later, may have the thickness of 0.2 mm at most.

The second main surface of first metal plate 70A includes second metal plate 80A, i.e., joint preparation region 73A for joining first power storage tab 80A. In the plan view of first metal plate 70A, joint preparation region 73A does not overlap a connection region in which first metal plate 70A is connected to first semiconductor element 2A.

Joint preparation region 73A is a region in which first metal plate 70A is later joined with second metal plate 80A at a later stage, and is a fixed range provided in first metal plate 70A in a stage before first metal plate 70A and second metal plate 80A are joined together.

Although it depends on the joining method of joining first metal plate 70A and second metal plate 80A, some kind of processing may be performed on joint preparation region 73A so that first metal plate 70A and second metal plate 80A are easier to join later For example, some kind of processing may be performed only on joint preparation region 73A in first metal plate 70A so that the thickness or surface roughness is different from the other region of first metal plate 70A, or another material different from the material composing first metal plate 70A may be formed only on the surface of joint preparation region 73A in first metal plate 70A.

Some kind of processing may not be performed on joint preparation region 73A. In this case, in the plan view of first metal plate 70A, joint preparation region 73A of first metal plate 70A may be equivalent to all of regions on the side opposite to the region in which first metal plate 70A is connected to first semiconductor element 2A, with bending axis 74 serving as a reference.

In Embodiment 1, first metal plate 70A is joined to second metal plate 80A, i.e., first power storage tab 80A in joint preparation region 73A.

First metal plate 70A and second metal plate 80A are described herein as being joined together by welding. However, as long as first metal plate 70A and second metal plate 80A are joined together to have conductivity, first metal plate 70A and second metal plate 80A do not necessarily need to be joined together by welding. First metal plate 70A and second metal plate 80A may be joined together by, for example, soldering.

First metal plate 70A is brought into conduction with second source terminals 121. More specifically, first metal plate 70A becomes conductive with second source terminal 121 via third metal plate 75A to be described later, metal component 85A to be described later, and first wiring 61 that is included in mounting substrate 60. First wiring 61 is connected to metal material 85A and to second source terminal 121 that is one of the plurality of external connection terminals of first semiconductor element 2A, both via conductive material 81. Therefore, first metal plate 70A has the same electric potential as second source terminal 121.

First metal plate 70A is bendable at a portion whose thickness is at most 0.2 mm to include a portion in which second main surfaces face each other.

Bending means mountain folding, valley folding, or curving (see, for instance, FIG. 18A to be described later) first metal plate 70A at bending axis 74. The cross section of first metal plate 70A after bending is typically U-shaped or J-shaped.

It is noted that first metal plate 70A has a bendable shape or material although first metal plate 70A is not bent in Embodiment 1. As described above, it is also for this reason that first metal plate 70A includes a portion whose thickness is at most 0.2 mm.

Figure 6:
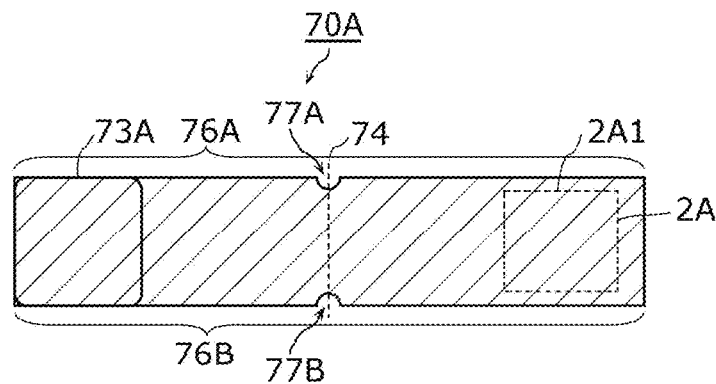
FIG. 6 is one example of a plan view of a first metal plate according to Embodiment 1.

FIG. 6 is one example of a plan view of first metal plate 70A when first metal plate 70A is viewed from the second main surface side of first metal plate 70A.

Bending axis 74 is a virtual axis included in first metal plate 70A that is to be bent at a later stage, and first metal plate 70A is bent along bending axis 74.

In many cases, first metal plate 70A in a state before being bent has structural characteristics that specify the position of bending axis 74 in the plan view of first metal plate 70A. However, first metal plate 70A may not have such structural characteristics. In such a case, the position of bending axis 74 inside first metal plate 70A can be considered as any position in which first metal plate 70A is bendable so that there is a portion in which first semiconductor element 2A overlaps joint preparation region 73A with first metal plate 70A interposed therebetween in the plan view of first semiconductor element 2A.

For example, first metal plate 70A may be bendable at bending axis 74 to include a portion in which second main surfaces face each other, and joint preparation region 73A and a connection region in which first metal plate 70A is connected to first semiconductor element 2A may be located on one side and the other side of bending axis 74 in the plan view of first metal plate 70A, as illustrated in FIG. 6.

This makes it possible to reduce a negative influence on first semiconductor element 2A caused by heat generated when first metal plate 70A is joined to second metal plate 80A.

In addition, it is possible to inhibit a negative influence on first semiconductor element 2A caused by a physical impact generated when first metal plate 70A is joined to second metal plate 80A.

As illustrated in FIG. 6, first semiconductor element 2A may be connected to first metal plate 70A in a direction in which first side 2A1 of first semiconductor element 2A is perpendicular to bending axis 74, and the length of a direction in which first metal plate 70A is perpendicular to bending axis 74 may be at least two times the length of first side 2A1 in the plan view of first metal plate 70A, for example.

This allows first metal plate 70A to have joint preparation region 73A having an area that is same as or greater than the connection region in the plan view of first metal plate 70A, in addition to the connection region in which first metal plate 70A is connected to first semiconductor element 2A.

As illustrated in FIG. 6, first metal plate 70A may be approximately rectangular including first approximately-straight side 76A and second approximately-straight side 76B that extend in a direction perpendicular to bending axis 74 in the plan view of first metal plate 70A, and first approximately-straight side 76A and second approximately-straight side 76B may respectively include recess 77A and recess 77B that are inwardly recessed portions of first metal plate 70A in the plan view of first metal plate 70A, for example. Recess 77A may be located at the intersection of bending axis 74 and first approximately-straight side 76A, and recess 77B may be located at the intersection of bending axis 74 and approximately-straight side 76B.

This makes it easier to bend first metal plate 70A at bending axis 74.

When first metal plate 70A is partly thinning-processed, it is desirable that recess 77A and recess 77B be disposed at a location that matches the thinning-processed portion of first metal plate 70A.

Figure 7:
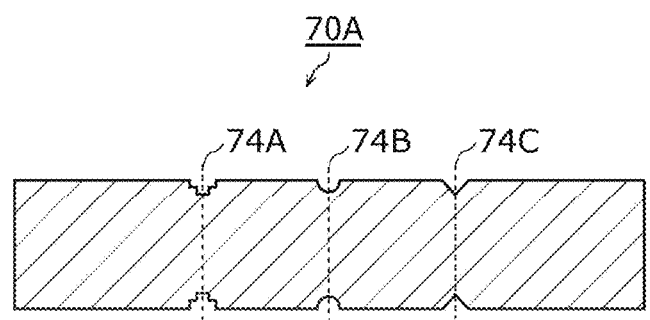
FIG. 7 is another example of the plan view of the first metal plate according to Embodiment 1.

FIG. 7 is another example of the plan view of first metal plate 70A when first metal plate 70A is viewed from the second main surface side of first metal plate 70A.

As illustrated in FIG. 7, first metal plate 70A may be bendable at a plurality of bending axes 74 (bending axis 74A, bending axis 74B, and bending axis 74C) to include a portion in which second main surfaces face each other.

Returning back to FIG. 1 and FIG. 2A, the description of first semiconductor device 1A continues.

Between first semiconductor element 2A and first metal plate 70A, third metal plate 75A is connected to first semiconductor element 2A on one main surface of first semiconductor element 2A and is connected to first metal plate 70A on the first main surface of first metal plate 70A, as illustrated in FIG. 2A.

Third metal plate 75A includes a metal material including copper, nickel, or stainless steel as one non-limiting example.

By including third metal plate 75A, first semiconductor device 1A can enhance the pressure tolerance of first semiconductor element 2A against pressure imposed on one main surface of first semiconductor element 2A from the second main surface side of first metal plate 70A.

The thickness and width of third metal plate 75A are adjusted to be appropriate in accordance with the magnitude of current conductive to first semiconductor element 2A so that heat dissipation is enhanced to inhibit an increase in the temperature of first semiconductor element 2A. For example, the width of third metal plate 75A may be greater than the width of first semiconductor element 2A in order to enhance the heat dissipation property of heat generated when first semiconductor element 2A is conductive.

As illustrated in FIG. 2A, one or more metal components 85A are connected to the main surface of third metal plate 75A at which third metal plate 75A is connected to first semiconductor element 2A. The location in which the main surface of third metal plate 75A is connected to the one or more metal components 85A is a location in which each of regions in which the main surface of third metal plate 75A is connected to the one or more metal components 85A does not overlap joint preparation region 73A in the plan view of first metal plate 70A.

When first semiconductor element 2A is mounted on mounting substrate 60, the one or more metal components 85A are mounted on mounting substrate 60 together with first semiconductor element 2A. In other words, the height of one or more metal components 85A from the main surface of third metal plate 75A is equal to the distance from the main surface of third metal plate 75A to the other main surface of first semiconductor element 2A.

By including the one or more metal components 85A, first semiconductor device 1A can further enhance the pressure tolerance of first semiconductor element 2A against pressure imposed on one main surface of first semiconductor element 2A from the second main surface side of first metal plate 70A.

As described above, at least one of the one or more metal components 85A is connected to first wiring 61 that is included in mounting substrate 60 via conductive material 81. First wiring 61 is connected to second source terminal 121 that is one of the plurality of external connection terminals of first semiconductor element 2A via conductive material 81. With this, first metal plate 70A and second source terminal 121 have the same electric potential, and first power storage tab 80A and first wiring 61 have the same electric potential.

The one or more metal components 85A may include the same material as third metal plate 75A, and may be integrated with third metal plate 75A, as illustrated in FIG. 2A. This can relatively simply achieve a structure that comprises third metal plate 75A and one or more metal components 85A.

Alternatively, the one or more metal components 85A may not be integrated with third metal plate 75A and may be separate from third metal plate 75A. In this case, the one or more metal components 85A include a metal material including copper, nickel, or stainless steel, as one non-limiting example.

Figure 8:
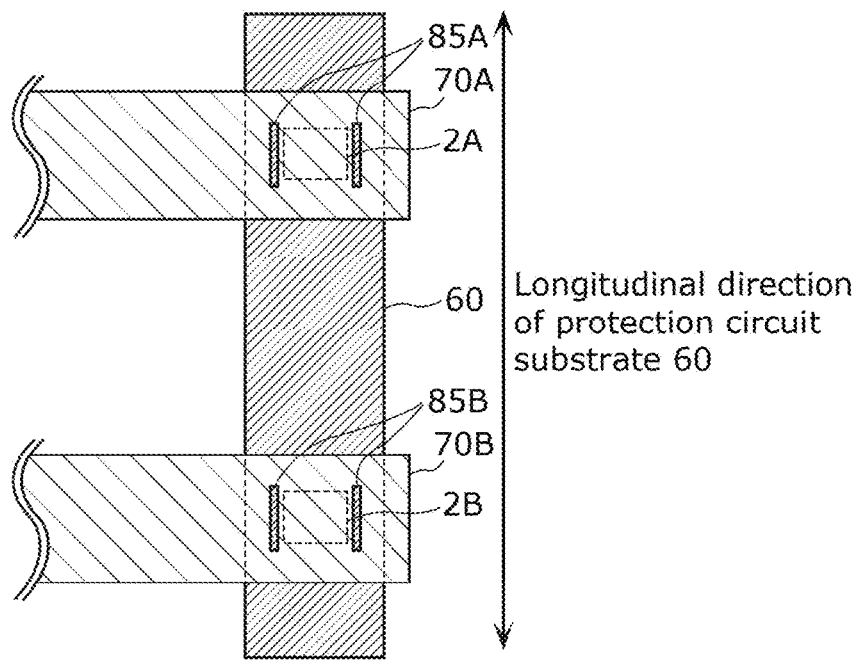
FIG. 8 is a plan view of the first semiconductor device according to Embodiment 1.

FIG. 8 is a plan view of first semiconductor device 1A viewed from the second main surface side of first metal plate 70A, illustrating one example of how first semiconductor device 1A includes one or more metal components 85A.

FIG. 8 illustrates, using dotted lines, a part of a portion that cannot actually be directly seen, as if the part of the portion can be seen.

For example, first semiconductor element 2A may have two sides in a direction parallel to the longitudinal direction of protection circuit substrate 60, and the one or more metal components 85A may include two metal components 85A disposed to face each other at the full length of these two sides, as illustrated in FIG. 8.

With this, part of stress imposed on first semiconductor element 2A is dispersed to these two metal components 85A. First semiconductor element 2A therefore becomes less likely to peel off from protection circuit substrate 60.

With this, since the one or more metal components 85A are disposed parallel to the longitudinal direction of protection circuit substrate 60, the limited width of protection circuit substrate 60 can be used as wiring to the fullest extent and the pattern width of a large current path in protection circuit substrate 60 can be readily secured.

Figure 9:
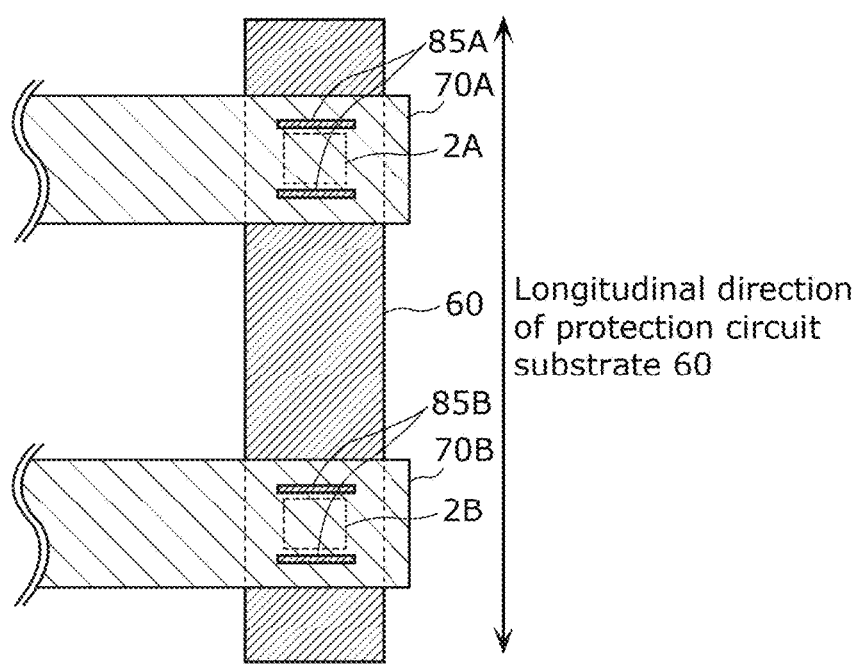
FIG. 9 is a plan view of the first semiconductor device according to Embodiment 1.

FIG. 9 is a plan view of first semiconductor device 1A viewed from the second main surface side of first metal plate 70A, illustrating another example of how first semiconductor device 1A includes one or more metal components 85A. FIG. 9 illustrates, using dotted lines, a part of a portion that cannot actually be directly seen, as if the part of the portion can be seen.

For example, first semiconductor element 2A may have two sides in a direction perpendicular to the longitudinal direction of protection circuit substrate 60, and the one or more metal components 85A may include two metal components 85A disposed to face each other at the full length of these two sides, as illustrated in FIG. 9.

With this, part of stress imposed on first semiconductor element 2A is dispersed to these two metal components 85A. First semiconductor element 2A therefore becomes less likely to peel off from protection circuit substrate 60.

With this, it is also possible to further reduce the width of protection circuit substrate 60 in the direction perpendicular to the longitudinal direction of protection circuit substrate 60. For this reason, the width of power storage pack 100 in the direction perpendicular to the longitudinal direction of protection circuit substrate 60 can be further reduced. In this case, when the size of power storage pack 100 is fixed, the size of power storage cell 3 can be further increased to further increase the power storage capacitance of power storage cell 3.

Figure 10:
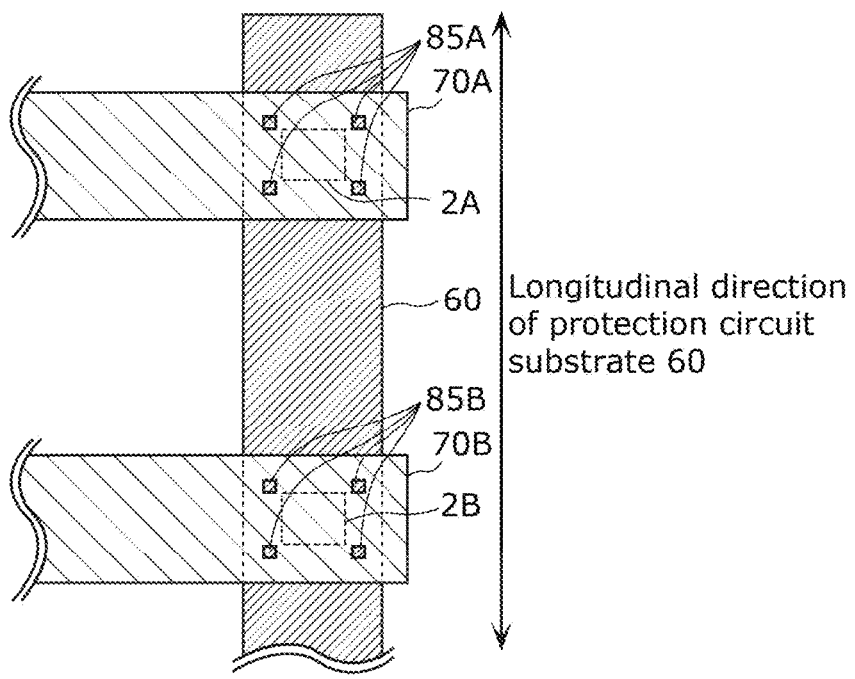
FIG. 10 is a plan view of the first semiconductor device according to Embodiment 1.

FIG. 10 is a plan view of first semiconductor device 1A viewed from the second main surface side of first metal plate 70A, illustrating yet another example of how first semiconductor device 1A includes one or more metal components 85A. FIG. 10 illustrates, using dotted lines, a part of a portion that cannot actually be directly seen, as if the part of the portion can be seen.

Figure 11:
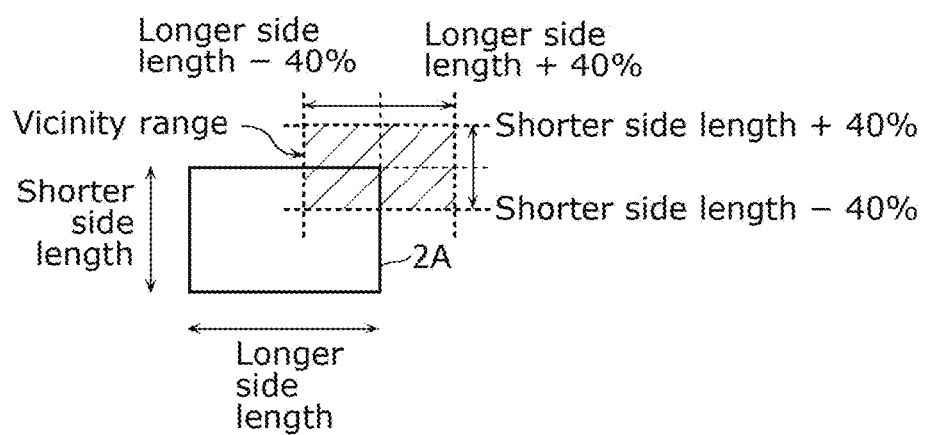
FIG. 11 is a diagram for describing the vicinity of each corner of the first semiconductor element according to Embodiment 1.

For example, the one or more metal components 85A may include four metal components 85A each disposed in the vicinity of a different one of four corners of first semiconductor element 2A, as illustrated in FIG. 10. As used herein, "in the vicinity of a different one of four corners of first semiconductor element 2A" means a range, in the surrounding region of each corner of first semiconductor element 2A, that is inside an extended area extended by plus or minus 40% of the length of each side of first semiconductor element 2A, as illustrated in FIG. 11.

With this, part of stress imposed on first semiconductor element 2A is dispersed to these four metal components 85A. First semiconductor element 2A therefore becomes less likely to peel off from protection circuit substrate 60.

The arrangement of metal component 85A needs to be made cautiously so that the wiring in protection circuit substrate 60 to which the substrate connection terminal of first semiconductor element 2A is connected will not extend its path or change its direction unnecessarily. Accordingly, it is desirable that metal component 85A be not provided between the substrate connection terminal of first semiconductor element 2A and the terminal of power storage pack 100 to which the wiring on protection circuit substrate 60 and the substrate connection terminal are connected.

This makes it easier to achieve both (i) easiness in securing the pattern width of a large current path in protection circuit substrate 60 described above, and (ii) a decrease in the width of power storage pack 100 described above or an increase in the power storage capacitance of power storage cell 3 described above.

The configuration of first semiconductor device 1A does not necessarily need to be limited to include one or more metal components 85A. In this case, however, an alternative means for equalizing the electric potential of first metal plate 70A and the electric potential of second source terminal 121 is necessary. A means for, for example, connecting first metal plate 70A to first wiring 61 using a lead wire is conceivable as such an alternative means.

Returning back to FIG. 1, FIG. 2A, and FIG. 2B, the description of power storage pack 100 continues.

Second semiconductor device 1B includes second semiconductor element 2B, second metal plate for power storage tab joint 70B, third metal plate 75B, and one or more metal components 85B. In the present description second metal plate for power storage tab joint 70B is also referred to as first metal plate 70B.

Second semiconductor device 1B is the same as first semiconductor device 1A. In other words, second semiconductor device 1B is the same as first semiconductor device 1A in which first semiconductor element 2A is read as second semiconductor element 2B, first metal plate for power storage tab joint 70A is read as second metal plate for power storage tab joint 70B, third metal plate 75A is read as third metal plate 75B, and metal component 85A is read as metal component 85B.

As described above, second semiconductor element 2B is the same as first semiconductor element 2A. More specifically, second semiconductor element 2B is the same as first semiconductor element 2A in which first gate terminal 119 is read as first gate terminal 219, first source terminal 111 is read as first source terminal 211, second gate terminal 129 is read as second gate terminal 229, second source terminal 121 is read as second source terminal 221, and drain electrode 30 is read as drain electrode 31.

As described above, first metal plate 70B is the same as first metal plate 70A. More specifically, first metal plate 70B is the same as first metal plate 70A in which joint preparation region 73A is read as joint preparation region 73B.

Like one or more metal components 85A, at least one of one or more metal components 85B is connected to third wiring 63 that is included in mounting substrate 60 via conductive material 81. Third wiring 63 is connected to second source terminal 221 that is one of a plurality of external connection terminals of second semiconductor element 2B via conductive material 81. With this, first metal plate 70B and second source terminal 221 have the same electric potential, and second power storage tab 80B and third wiring 63 have the same electric potential.

Protection circuit substrate 60 includes first wiring 61, second wiring 62, third wiring 63, fourth wiring 64, power storage pack positive electrode terminal 66, and power storage pack negative electrode terminal 67.

First semiconductor element 2A and second semiconductor element 2B are mounted on protection circuit substrate 60 via conductive material 81.

First wiring 61 is connected to at least one of the one or more metal components 85A and also to second source terminal 121, both via conductive material 81.

Second wiring 62 is connected to first source terminal 111 via conductive material 81 and is also connected to power storage pack positive electrode terminal 66.

Third wiring 63 is connected to at least one of the one or more metal components 85B and also to second source terminal 221, both via conductive material 81.

Fourth wiring 64 is connected to first source terminal 211 via conductive material 81 and is also connected to power storage pack negative electrode terminal 67.

Power storage pack positive electrode terminal 66 is a terminal for current to flow out to, for instance, an external device of power storage pack 100 or for current to flow in from, for instance, an external terminal of power storage pack 100. Power storage pack positive electrode terminal 66 functions as the positive electrode terminal of power storage pack 100.

Power storage pack negative electrode terminal 67 is a terminal for current to flow out to, for instance, an external device of power storage pack 100 or for current to flow in from, for instance, an external terminal of power storage pack 100. Power storage pack negative electrode terminal 67 functions as the negative electrode terminal of power storage pack 100.

(Observations)

Figure 12:
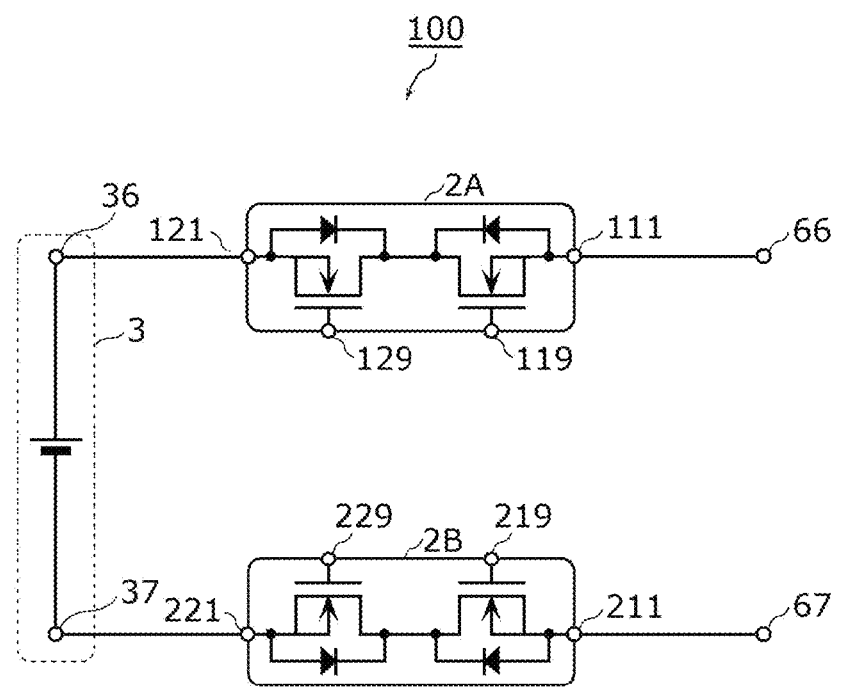
FIG. 12 is a circuit diagram of the power storage pack according to Embodiment 1.

FIG. 12 is a circuit diagram of power storage pack 100 having the above-described configuration.

As illustrated in FIG. 12, first semiconductor element 2A functions as a switching element to switch between a current path along which current flows from positive electrode terminal 36 of power storage cell 3 to power storage pack positive electrode terminal 66 and a current path along which current flows from power storage pack positive electrode terminal 66 to positive electrode terminal 36 of power storage cell 3.

In other words, owing to first semiconductor element 2A, which is a switching element, becoming conductive from second source terminal 121 to first source terminal 111, the electric potential on the second source terminal 121 side becomes higher than the electric potential on the first source terminal 111 side, and this forms a current path along which current flows from power storage cell 3 in order of power storage cell 3, first power storage tab 80A, first metal plate for power storage tab joint 70A, and first semiconductor element 2A. Owing to first semiconductor element 2A becoming conductive from first source terminal 111 to second source terminal 121, the electric potential on the first source terminal 111 side becomes higher than the electric potential on the second source terminal 121 side, and this forms a current path along which current flows from first semiconductor element 2A in order of first semiconductor element 2A, first metal plate for power storage tab joint 70A, first power storage tab 80A, and power storage cell 3.

Second semiconductor element 2B also functions as a switching element to switch between a current path along which current flows from negative electrode terminal 37 of power storage cell 3 to power storage pack negative electrode terminal 67 and a current path along which current flows from power storage pack negative electrode terminal 67 to negative electrode terminal 37 of power storage cell 3.

In other words, owing to second semiconductor element 2B, which is a switching element, becoming conductive from second source terminal 221 to first source terminal 211, the electric potential on the second source terminal 221 side becomes higher than the electric potential on the first source terminal 211 side, and this forms a current path along which current flows from power storage cell 3 in order of power storage cell 3, second power storage tab 80B, second metal plate for power storage tab joint 70B, and second semiconductor element 2B. Owing to second semiconductor element 2B becoming conductive from first source terminal 211 to second source terminal 221, the electric potential on the first source terminal 211 side becomes higher than the electric potential on the second source terminal 221 side, and this forms a current path along which current flows from second semiconductor element 2B in order of second semiconductor element 2B, second metal plate for power storage tab joint 70B, second power storage tab 80B, and power storage cell 3.

For this reason, first semiconductor element 2A and second semiconductor element 2B, each of which is a switching element, can therefore control charging or discharging of power storage cell 3 in protection circuit substrate 60.

As illustrated in FIG. 12, power storage pack 100 includes, on the high side of power storage cell 3, first semiconductor element 2A which is a switching element that controls (i) a current path along which current flows from positive electrode terminal 36 to power storage pack positive electrode terminal 66 and (ii) a current path along which current flows from power storage pack positive electrode terminal 66 to positive electrode terminal 36. Power storage pack 100 also includes, on the low side of power storage cell 3, second semiconductor element 2B which is a switching element that controls (i) a current path along which current flows from negative electrode terminal 37 to power storage pack negative electrode terminal 67 and (ii) a current path along which current flows from power storage pack negative electrode terminal 67 to negative electrode terminal 37.

With this, power storage pack 100 can achieve double protection of power storage cell 3 both on the high side and the low side of power storage cell 3.

According to power storage pack 100 having the above-described configuration, first power storage tab 80A and second power storage tab 80B are respectively joined to first metal plate for power storage tab joint 70A and second metal plate for power storage tab joint 70B, as described above.

With this, power storage pack 100 having the above-described configuration neither requires, in protection circuit substrate 60, a region for connecting first power storage tab 80A nor a region for connecting second power storage tab 80B, which is required in a conventional power storage pack for directly connecting first power storage tab 80A and second power storage tab 80B to protection circuit substrate 60.

Accordingly, with power storage pack 100 having the above-described configuration, it is possible to achieve reduction in the size of protection circuit substrate 60.

With power storage pack 100 having the above-described configuration, it is also possible to inhibit an increase in the temperatures of first semiconductor element 2A and second semiconductor element 2B by enhancing the heat dissipation properties of first semiconductor element 2A and second semiconductor element 2B owing to first metal plate for power storage tab joint 70A and first power storage tab 80A being connected to first semiconductor element 2A as well as second metal plate for power storage tab joint 70B and second power storage tab 80B being connected to second semiconductor element 2B.

In power storage pack 100, first semiconductor element 2A, third metal plate 75A, and first metal plate 70A may be further fixed with a mold to increase its solidness, while second semiconductor element 2B, third metal plate 75B, and first metal plate 70B may be further fixed with a mold to increase its solidness.

In power storage pack 100, power circuit substrate 60 may include embedded wiring, and first semiconductor element 2A and second semiconductor element 2B may be embedded in a protection circuit substrate that includes embedded wiring.

Figure 13:
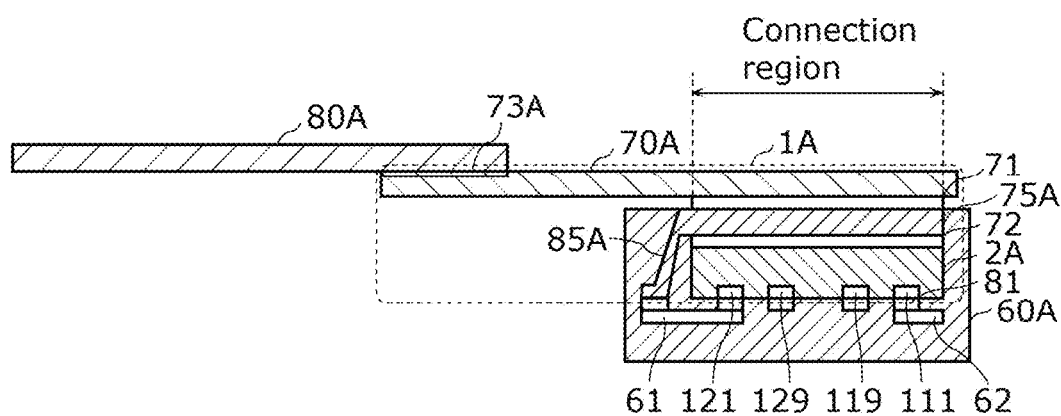
FIG. 13 is a cross-sectional view of a protection circuit substrate and the first semiconductor element according to Embodiment 1.

FIG. 13 is a cross-sectional view of protection circuit substrate 60A and first semiconductor element 2A in the case where first semiconductor element 2A and second semiconductor element 2B are embedded in protection circuit substrate 60A that includes embedded wiring.

As illustrated in FIG. 13, the substrate connection terminals of first semiconductor element 2A and second semiconductor element 2B (second semiconductor element 2B is not shown in FIG. 13) may be mounted in wiring embedded in protection circuit substrate 60A.

In this case, conductive material 81 may be achieved with, for example, a silver paste, or copper or gold crimping (by means of ultrasonic waves or heat), and conductive material 71 may be achieved with, for example, solder.

In power storage pack 100, protection circuit substrate 60 may be a protection circuit substrate adapted for resin embedding, and first semiconductor element 2A and second semiconductor element 2B may be embedded in a protection circuit substrate adapted for resin embedding.

Figure 14:
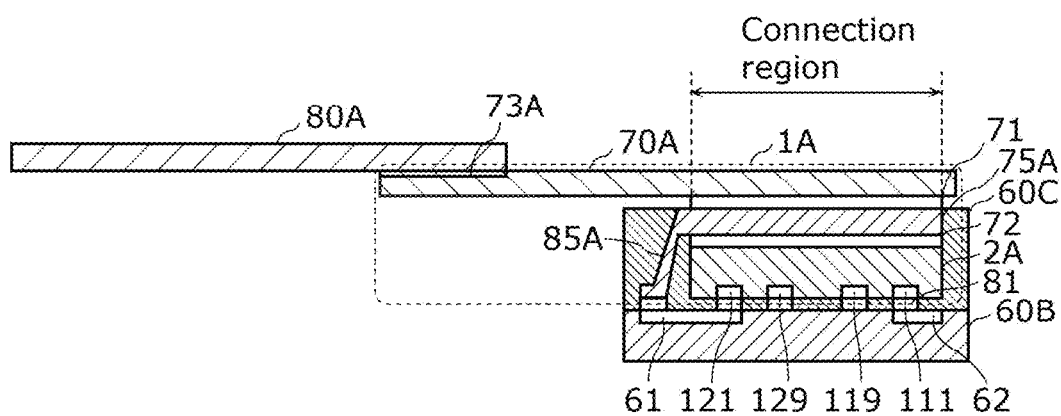
FIG. 14 is a cross-sectional view of the protection circuit substrate and the first semiconductor element according to Embodiment 1.

FIG. 14 is a cross-sectional view of protection circuit substrate 60B and first semiconductor element 2A in the case where first semiconductor element 2A and second semiconductor element 2B are embedded in protection circuit substrate 60B adapted for resin embedding.

As illustrated in FIG. 14, the substrate connection terminals of first semiconductor element 2A and second semiconductor element 2B (second semiconductor element 2B is not shown in FIG. 14) may be mounted in wiring embedded in resin 60C.

In this case, conductive material 81 may be achieved, for example, with a silver paste, or copper or gold crimping (by means of ultrasonic waves or heat), and conductive material 71 may be achieved with, for example, solder.

In power storage pack 100, the length of first metal plate 70A extending in the direction from joint preparation region 73A to a region in which first metal plate 70A is connected to first semiconductor element 2A, in the plan view of first semiconductor element 2A, may be the length extending beyond first semiconductor element 2A, as illustrated in FIG. 2A, or may be the length stopping at a position that does not exceed first semiconductor element 2A.

Embodiment 2

Hereinafter, a power storage pack according to Embodiment 2 configured by modifying part of the configuration of power storage pack 100 according to Embodiment 1 will be described.

Power storage pack 100 is a configuration example in which (i) first semiconductor device 1A includes third metal plate 75A interposed between first metal plate 70A and first semiconductor element 2A, (ii) first metal plate 70A is connected to first semiconductor element 2A with third metal plate 75A interposed therebetween, (iii) second semiconductor device 1B includes third metal plate 75B interposed between first metal plate 70B and second semiconductor element 2B, and (iv) first metal plate 70B is connected to second semiconductor element 2B with third metal plate 75B interposed therebetween.

In contrast, the power storage pack according to Embodiment 2 is a configuration example in which (i) a first semiconductor device according to Embodiment 2 does not include third metal plate 75A, (ii) first metal plate 70A is connected to first semiconductor element 2A without third metal plate 75A interposed therebetween, (iii) a second semiconductor device according to Embodiment 2 does not include third metal plate 75B, and (iv) first metal plate 70B is connected to second semiconductor element 2B without third metal plate 75B interposed therebetween.

Elements of the power storage pack according to Embodiment 2 which are the same as those of power storage pack 100 are assigned with like reference signs, and detailed description thereof is omitted as having already been explained. The following focuses on the difference between the power storage pack according to Embodiment 2 and power storage pack 100.

(Configuration)

Figure 15:
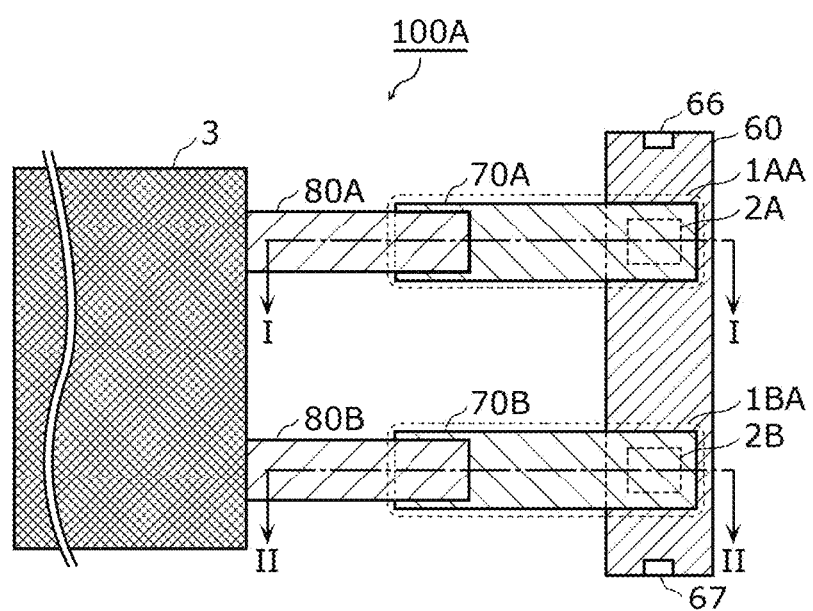
FIG. 15 is a plan view illustrating the configuration of a power storage pack according to Embodiment 2.
Figure 16A:
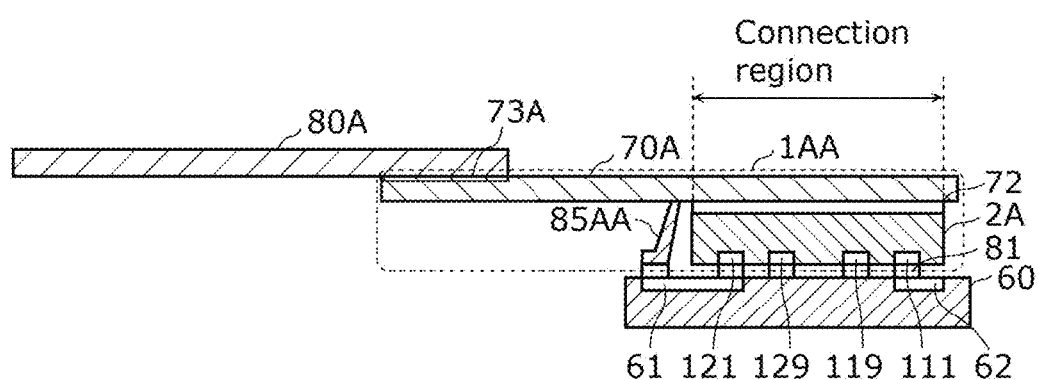
FIG. 16A is a cross-sectional view illustrating the configuration of the power storage pack according to Embodiment 2.
Figure 16B:
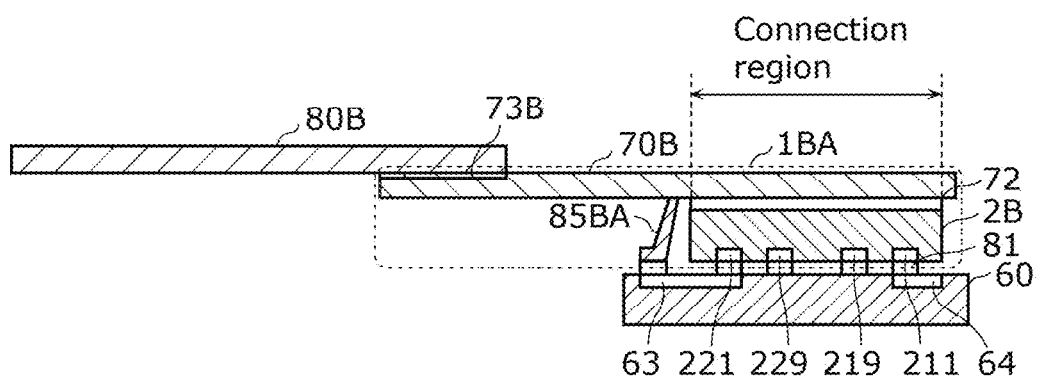
FIG. 16B is a cross-sectional view illustrating the configuration of the power storage pack according to Embodiment 2.

FIG. 15 is a plan view illustrating the configuration of power storage pack 100A according to Embodiment 2. FIG. 16A is a cross-sectional view illustrating a cross section taken at line I-I in FIG. 15. FIG. 16B is a cross-sectional view illustrating a cross section taken at line II-II in FIG. 15. FIG. 15 illustrates, using dotted lines, a part of a portion that cannot actually be directly seen, as if the part of the portion can be seen.

As illustrated in FIG. 15, FIG. 16A, and FIG. 16B, power storage pack 100A is configured by modifying power storage pack 100 according to Embodiment 1 so that first semiconductor device 1A is changed to first semiconductor device 1AA and second semiconductor device 1B is changed to second semiconductor device 1BA.

First semiconductor device 1AA is configured by removing third metal plate 75A from first semiconductor device 1A and changing metal component 85A to metal component 85AA.

In first semiconductor device 1AA, first metal plate 70A is connected, on the first main surface thereof, to one main surface of first semiconductor element 2A via insulating material 72. First metal plate 70A is therefore insulated from drain electrode 30.

In first semiconductor device 1AA, one or more metal components 85AA are connected to the first main surface, of first metal plate 70A, on which first metal plate 70A is connected to first semiconductor element 2A, as illustrated in FIG. 16A. The location in which the first main surface is connected to the one or more metal components 85AA is a location in which each of regions in which the first main surface is connected to the one or more metal components 85AA does not overlap joint preparation region 73A in the plan view of first metal plate 70A.

When first semiconductor element 2A is mounted on mounting substrate 60, the one or more metal components 85AA are mounted on mounting substrate 60 together with first semiconductor element 2A. In other words, the height of the one or more metal components 85AA from the first main surface of first metal plate 70A is equal to the distance from the first main surface of first metal plate 70A to the other main surface of first semiconductor element 2A.

By including one or more metal components 85AA, first semiconductor device 1AA can enhance the pressure tolerance of first semiconductor element 2A against pressure imposed on one main surface of first semiconductor element 2A from the second main surface side of first metal plate 70A.

In first semiconductor device 1AA, at least one of the one or more metal components 85AA is connected to first wiring 61 that is included in mounting substrate 60 via conductive material 81. With this, first metal plate 70A and second source terminal 121 have the same electric potential and first power storage tab 80A and first wiring 61 have the same electric potential.

The one or more metal components 85AA may include the same material as first metal plate 70A, and may be integrated with first metal plate 70A, as illustrated in FIG. 16A. This can relatively simply achieve a structure that comprises first metal plate 70A and one or more metal components 85AA.

Alternatively, the one or more metal components 85AA may not be integrated with first metal plate 70A and may be separate from first metal plate 70A. In this case, the one or more metal components 85AA include a metal material including copper, nickel, or stainless steel, as one non-limiting example.

In first semiconductor device 1AA, first semiconductor element 2A, as is the case of first semiconductor device 1A illustrated in FIG. 8, may have two sides in a direction parallel to the longitudinal direction of protection circuit substrate 60, and one or more metal components 85AA may include two metal components 85AA disposed to face each other at the full length of these two sides.

With this, part of stress imposed on first semiconductor element 2A is dispersed to these two metal components 85AA. First semiconductor element 2A therefore becomes less likely to peel off from protection circuit substrate 60.

With this, since the one or more metal components 85AA are disposed parallel to the longitudinal direction of protection circuit substrate 60, the limited width of protection circuit substrate 60 can be used as wiring to the fullest extent and the pattern width of a large current path in protection circuit substrate 60 can be readily secured.

In first semiconductor device 1AA, first semiconductor element 2A, as is the case of first semiconductor device 1A illustrated in FIG. 9, may have two sides in a direction perpendicular to the longitudinal direction of protection circuit substrate 60, and one or more metal components 85AA may include two metal components 85AA disposed to face each other at the full length of these two sides.

With this, part of stress imposed on first semiconductor element 2A is dispersed to these two metal components 85AA. First semiconductor element 2A therefore becomes less likely to peel off from protection circuit substrate 60.

With this, it is also possible to reduce the width of protection circuit substrate 60 in a direction perpendicular to the longitudinal direction of protection circuit substrate 60. For this reason, the width of power storage pack 100A in the direction perpendicular to the longitudinal direction of protection circuit substrate 60 can be further reduced. In this case, when the size of power storage pack 100A is fixed, the size of power storage cell 3 can be further increased to further increase the power storage capacitance of power storage cell 3.

In first semiconductor device 1AA, the one or more metal components 85AA may include four metal components 85AA each disposed in the vicinity of a different one of four corners of first semiconductor element 2A, as is the case of first semiconductor device 1A illustrated in FIG. 10.

With this, part of stress imposed on first semiconductor element 2A is dispersed to these four metal components 85AA. First semiconductor element 2A therefore becomes less likely to peel off from protection circuit substrate 60.

This makes it easier to achieve both easiness in securing the pattern width of a large current path in protection circuit substrate 60 described above, and a reduction in the width of power storage pack 100 described above or an increase in the power storage capacitance of power storage cell 3 described above.

The configuration of first semiconductor device 1AA does not necessarily need to be limited to include one or more metal components 85AA. In this case, however, an alternative means for equalizing the electric potential of first metal plate 70A and the electric potential of second source terminal 121 is necessary. A means for, for example, connecting first metal plate 70A to first wiring 61 using a lead wire is conceivable as such an alternative means.

Second semiconductor device 1BA is configured by removing third metal plate 75B from second semiconductor device 1B and changing metal component 85B to metal component 85BA.

Second semiconductor device 1BA is the same as first semiconductor device 1AA. In other words, second semiconductor device 1BA is the same as first semiconductor device 1AA in which first semiconductor element 2A is read as second semiconductor element 2B, first metal plate for power storage tab joint 70A is read as second metal plate for power storage tab joint 70B, and metal component 85AA is read as metal component 85BA.

Like one or more metal components 85AA in first semiconductor device 1AA, at least one of one or more metal components 85BA in second semiconductor device 1BA is connected to third wiring 63 that is included in mounting substrate 60 via conductive material 81. With this, first metal plate 70B and second source terminal 221 have the same electric potential, and second power storage tab 80B and third wiring 63 have the same electric potential.

(Observations)

The circuit diagram of power storage pack 100A having the above-described configuration is the same as the circuit diagram in FIG. 12 illustrated as the circuit diagram of power storage pack 100 according to Embodiment 1.

Accordingly, in power storage pack 100A, first semiconductor element 2A functions as a switching element that is the same as first semiconductor element 2A in power storage pack 100. In power storage pack 100A, second semiconductor element 2B functions as a switching element that is the same as second semiconductor element 2B in power storage pack 100.

Embodiment 3

Hereinafter, a power storage pack according to Embodiment 3 configured by modifying part of the configuration of power storage pack 100 according to Embodiment 1 will be described.

The power storage pack according to Embodiment 3 is a configuration example in which the power storage pack is configured by modifying power storage pack 100 so that first metal plate for power storage tab joint 70A and second metal plate for power storage tab joint 70B are changed to a first metal plate for power storage tab joint and a second metal plate for power storage tab joint according to Embodiment 3 each of which is bent at bending axis 74.

Elements of the power storage pack according to Embodiment 3 which are the same as those of power storage pack 100 are assigned with like reference signs, and detailed description thereof is omitted as having already been explained. The following focuses on the difference between the power storage pack according to Embodiment 3 and power storage pack 100.
(Configuration)

Figure 17:
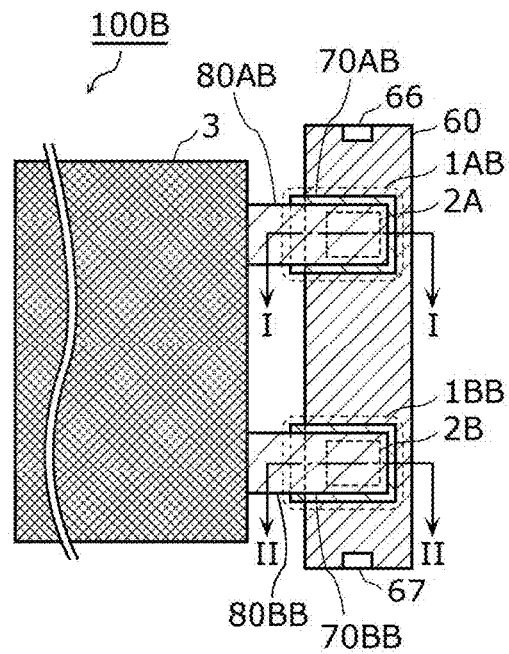
FIG. 17 is a plan view illustrating the configuration of a power storage pack according to Embodiment 3.
Figure 18A:
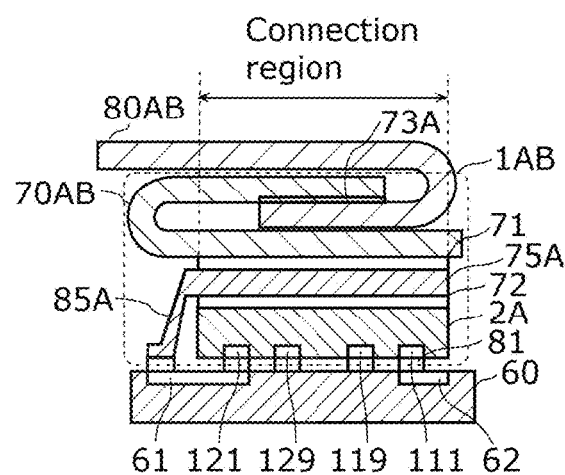
FIG. 18A is a cross-sectional view illustrating the configuration of the power storage pack according to Embodiment 3.
Figure 18B:
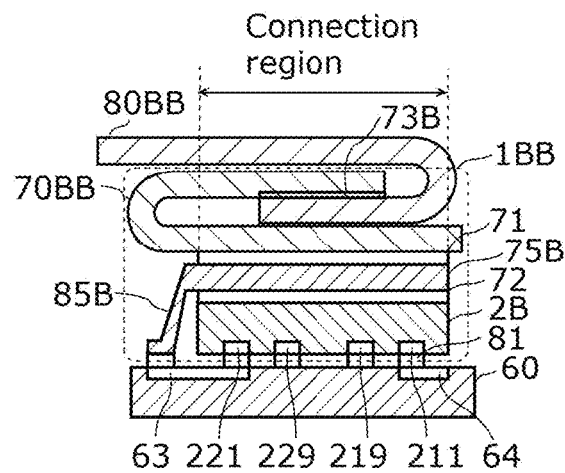
FIG. 18B is a cross-sectional view illustrating the configuration of the power storage pack according to Embodiment 3.

FIG. 17 is a plan view illustrating the configuration of power storage pack 100B according to Embodiment 3. FIG. 18A is a cross-sectional view illustrating a cross section taken at line I-I in FIG. 17. FIG. 18B is a cross-sectional view illustrating a cross section taken at line II-II in FIG. 17. FIG. 17 illustrates, using dotted lines, a part of a portion that cannot actually be directly seen, as if the part of the portion can be seen.

As illustrated in FIG. 17, FIG. 18A, and FIG. 18B, power storage pack 100B is configured by modifying power storage pack 100 according to Embodiment 1 so that first semiconductor device 1A is changed to first semiconductor device 1AB, second semiconductor device 1B is changed to second semiconductor device 1BB, first power storage tab 80A is changed to first power storage tab 80AB, and second power storage tab 80B is changed to second power storage tab 80BB. In the present description, first power storage tab 80AB is also referred to as second metal plate 80AB and second power storage tab 80BB is also referred to as second metal plate 80BB.

First semiconductor device 1AB is configured by modifying first semiconductor device 1A so that first metal plate 70A is changed to first metal plate 70AB. In the present description, first metal plate 70AB is also referred to as first metal plate for power storage tab joint 70AB.

First metal plate 70AB is the same as what first metal plate 70A is bent at bending axis 74 to include a portion in which second main surfaces face each other. The location of bending axis 74 is the location at which a portion in which first semiconductor element 2A overlaps joint preparation region 73A with first metal plate 70A interposed therebetween is present in the plan view of first semiconductor element 2A. For this reason, in first semiconductor device 1AB, there is a portion in which first semiconductor element 2A overlaps joint preparation region 73A with first metal plate 70AB interposed therebetween in the plan view of first semiconductor element 2A. In first semiconductor device 1AB, there is also a portion in which first semiconductor element 2A overlaps first power storage tab 80AB with first metal plate for power storage tab joint 70AB interposed therebetween in the plan view of semiconductor element 2A. Accordingly, first semiconductor device 1AB includes a portion in which first power storage tab 80AB, first metal plate 70AB, first semiconductor element 2A, and protection circuit substrate 60 overlap each other in the plan view of protection circuit substrate 60.

This results in power storage pack 100B having a portion in which a region through which current may flow between first power storage tab 80AB and protection circuit substrate 60 overlaps a region in which first power storage tab 80AB, first metal plate 70AB, first semiconductor element 2A, and protection circuit substrate 60 overlap each other, in the plan view of protection circuit substrate 60.

A region in which current may flow between first power storage tab 80AB and protection circuit substrate 60 is a whole region in which current may flow between first power storage tab 80AB and protection circuit substrate 60, i.e., the whole region of a conductor that is continuously present between first power storage tab 80AB and protection circuit substrate 60. This conductor includes first power storage tab 80AB itself. In FIG. 18A, the whole region corresponds to the whole of first power storage tab 80AB, the whole of first metal plate 70AB, the whole of conductive material 71, the whole of third metal plate 75A, the whole of metal component 85A, the whole of conductive material 81, first wiring 61, the whole of first semiconductor element 2A, and second wiring 62.

As illustrated in FIG. 6 and FIG. 7, the direction of bending axis 74 is described as being a direction perpendicular to first side 2A1 of first semiconductor element 2A, but does not necessarily need to be limited to the direction perpendicular to first side 2A1 of first semiconductor element 2A so long as (1) first metal plate 70A is bent at bending axis 74 to include a portion in which second main surfaces face each other and (2) there is a portion in which first semiconductor element 2A overlaps joint preparation region 73A with first metal plate 70A interposed therebetween in the plan view of first semiconductor element 2A.

Second semiconductor device 1BB is configured by modifying second semiconductor device 1B so that first metal plate 70B is changed to first metal plate 70BB. In the present description, first metal plate 70BB is also referred to as second metal plate for power storage tab joint 70BB.

Second semiconductor device 1BB is the same as first semiconductor device 1AB. In other words, second semiconductor device 1BB is the same as first semiconductor device 1AB in which first semiconductor element 2A is read as second semiconductor element 2B and first metal plate for power storage tab joint 70AB is read as second metal plate for power storage tab joint 70BB.

First power storage tab 80AB is the same as what first power storage tab 80A according to Embodiment 1 is bent to include a portion in which planes to be joined to first metal plate 70A in joint preparation region 73A face each other.

Second power storage tab 80BB is the same as what second power storage tab 80B according to Embodiment 1 is bent to include a portion in which planes to be joined to first metal plate 70B in joint preparation region 73B face each other.
(Observations)

The circuit diagram of power storage pack 100B having the above-described configuration is the same as the circuit diagram in FIG. 12 illustrated as the circuit diagram of power storage pack 100 according to Embodiment 1.

Accordingly, in power storage pack 100B, first semiconductor element 2A functions as a switching element that is the same as first semiconductor element 2A in power storage pack 100. In power storage pack 100B, second semiconductor element 2B functions as a switching element that is the same as second semiconductor element 2B in power storage pack 100.

In addition, in the plan view of protection circuit substrate 60, the size of power storage pack 100B having the above-described configuration, as compared with power storage pack 100, can be reduced by (i) a region in which not only first power storage tab 80AB overlaps first metal plate for power storage tab joint 70AB, but also first power storage tab 80AB, first metal plate for power storage tab joint 70AB, first semiconductor element 2A, and protection circuit substrate 60 overlap each other and (ii) a region in which second power storage tab 80BB, second metal plate for power storage tab joint 70BB, second semiconductor element 2B, and protection circuit substrate 60 overlap each other. When the size of power storage pack 100B is fixed, the size of power storage cell 3 can be further increased so that the power storage capacitance of power storage cell 3 can be further increased.

Since joining first power storage tab 80AB to first metal plate for power storage tab joint 70AB in a state in which first power storage tab 80AB and first metal plate for power storage tab joint 70AB are not bent allows subsequently bending first power storage tab 80AB and first metal plate for power storage tab joint 70AB while reducing a negative influence on first semiconductor element 2A due to heat generated when first power storage tab 80AB is joined to first metal plate for power storage tab joint 70AB and a negative influence on first semiconductor element 2A due to a physical impact generated when first power storage tab 80AB is joined to first metal plate for power storage tab joint 70AB. It is therefore possible to reduce the size of protection circuit substrate 60 and increase the power storage capacitance of power storage cell 3.

In power storage pack 100B, when area A that is the area, in the plan view of protection circuit substrate 60, of a portion in which first power storage tab 80AB is joined to first metal plate for power storage tab joint 70AB is greater than area B that is the area, in the plan view of protection circuit substrate 60, of first semiconductor element 2A, area C that is the difference between area A and area B (area A-area B) can be used to enhance the properties of first semiconductor element 2A. For example, the on-resistance of first semiconductor element 2A that is a switching element can be reduced by increasing the area of first semiconductor element 2A in the plan view of protection circuit substrate 60 to a size that is approximately the same as the size of area A.

In a conventional power storage pack that directly connects first power storage tab 80AB to protection circuit substrate 60, when area D that is the area, in the plan view of protection circuit substrate 60, of a portion in which first power storage tab 80AB is connected to protection circuit substrate 60 is greater than the above-described area A in power storage pack 100B, the width of first power storage tab 80AB in power storage pack 100B can be reduced to be less than the width of first power storage tab 80AB in the conventional power storage pack in some cases. In such cases, the size of power storage pack 100 can be reduced owing to double effects, i.e., an effect that a region for connecting first power storage tab 80AB to protection circuit substrate 60 which was necessary in protection circuit substrate 60 of the above-described conventional power storage pack, becomes unnecessary and an effect that the width of first power storage tab 80AB can be further reduced. When the size of power storage pack 100B is fixed, the size of power storage cell 3 can be further increased to further increase the power storage capacitance of power storage cell 3 owing to the above-described double effects.

Embodiment 4

Hereinafter, a power storage pack according to Embodiment 4 configured by modifying part of the configuration of power storage pack 100A according to Embodiment 2 will be described.

The power storage pack according to Embodiment 4 is a configuration example in which the power storage pack is configured by modifying power storage pack 100A so that first metal plate for power storage tab joint 70A and second metal plate for power storage tab joint 70B are changed to a first metal plate for power storage tab joint and a second metal plate for power storage tab joint according to Embodiment 4 each of which is bent at bending axis 74.

Elements of the power storage pack according to Embodiment 4 which are the same as those of power storage pack 100A are assigned with like reference signs, and detailed description thereof is omitted as having already been explained. The following focuses on the difference between the power storage pack according to Embodiment 4 and power storage pack 100A.

(Configuration)

Figure 19:
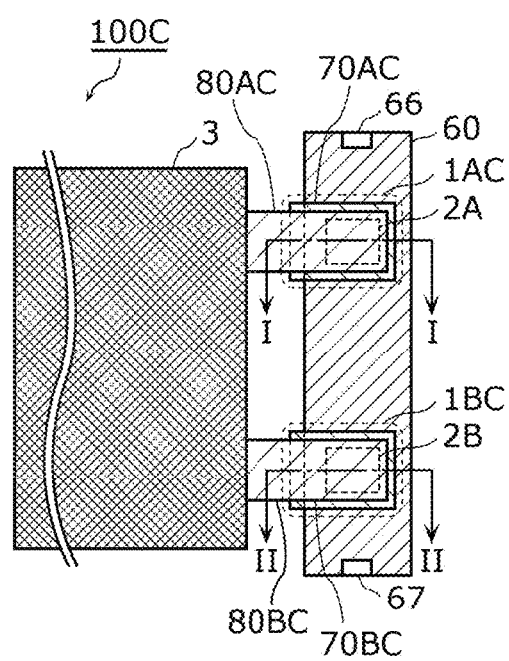
FIG. 19 is a plan view illustrating the configuration of a power storage pack according to Embodiment 4.
Figure 20A:
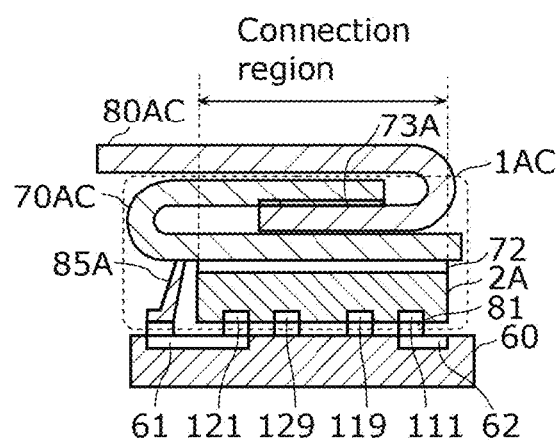
FIG. 20A is a cross-sectional view illustrating the configuration of the power storage pack according to Embodiment 4.
Figure 20B:
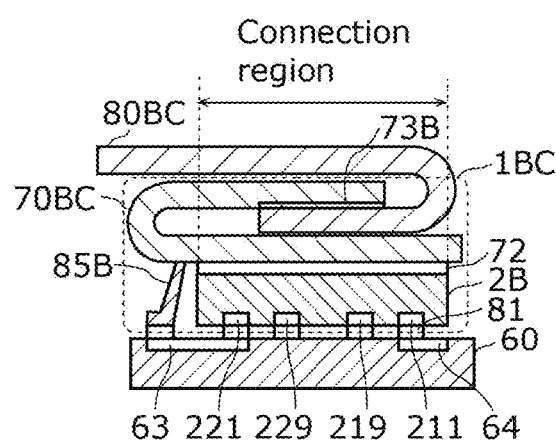
FIG. 20B is a cross-sectional view illustrating the configuration of the power storage pack according to Embodiment 4.

FIG. 19 is a plan view illustrating the configuration of power storage pack 100C according to Embodiment 4. FIG. 20A is a cross-sectional view illustrating a cross section taken at line I-I in FIG. 19. FIG. 20B is a cross-sectional view illustrating a cross section taken at line II-II in FIG. 19. FIG. 19 illustrates, using dotted lines, a part of a portion that cannot actually be directly seen, as if the part of the portion can be seen.

As illustrated in FIG. 19, FIG. 20A, and FIG. 20B, power storage pack 100C is configured by modifying power storage pack 100A according to Embodiment 2 so that first semiconductor device 1AA is changed to first semiconductor device 1AC, second semiconductor device 1BA is changed to second semiconductor device 1BC, first power storage tab 80A is changed to first power storage tab 80AC, and second power storage tab 80B is changed to second power storage tab 80BC. In the present description, first power storage tab 80AC is also referred to as second metal plate 80AC and second power storage tab 80BC is also referred to as second metal plate 80BC.

First semiconductor device 1AC is configured by modifying first semiconductor device 1AA so that first metal plate 70A is changed to first metal plate 70AC. In the present description, first metal plate 70AC is also referred to as first metal plate for power storage tab joint 70AC.

First metal plate 70AC is the same as what first metal plate 70A is bent at bending axis 74 to include a portion in which second main surfaces face each other. The location of bending axis 74 is a location at which first semiconductor element 2A overlaps joint preparation region 73A with first metal plate 70A interposed therebetween is present in the plan view of first semiconductor element 2A. For this reason, in first semiconductor device 1AC, there is a portion in which first semiconductor element 2A overlaps joint preparation region 73A with first metal plate 70AC interposed therebetween in the plan view of first semiconductor element 2A. In first semiconductor device 1AC, there is also a portion in which first semiconductor element 2A overlaps first power storage tab 80AC with first metal plate for power storage tab joint 70AB interposed therebetween in the plan view of first semiconductor element 2A.

This results in power storage pack 100C having a portion in which a region through which current may flow between first power storage tab 80AC and protection circuit substrate 60 overlaps a region in which first semiconductor element 2A overlaps first power storage tab 80AC with first metal plate for power storage tab joint 70AC interposed therebetween, in the plan view of protection circuit substrate 60.

Second semiconductor device 1BC is configured by modifying second semiconductor device 1BA so that first metal plate 70B is changed to first metal plate 70BC. In the present description, first metal plate 70BC is also referred to as second metal plate for power storage tab joint 70BC.

Second semiconductor device 1BC is the same as first semiconductor device 1AC. In other words, second semiconductor device 1BC is the same as first semiconductor device 1AC in which first semiconductor element 2A is read as second semiconductor element 2B and first metal plate for power storage tab joint 70AC is read as second metal plate for power storage tab joint 70BC.

First power storage tab 80AC is the same as what first power storage tab 80A according to Embodiment 2 is bent to include a portion in which planes to be joined to first metal plate 70A in joint preparation region 73A face each other.

Second power storage tab 80BC is the same as what second power storage tab 80B according to Embodiment 2 is bent to include a portion in which planes to be joined to first metal plate 70B in joint preparation region 73B face each other.

(Observations)

The circuit diagram of power storage pack 100C having the above-described configuration is the same as the circuit diagram in FIG. 12 illustrated as the circuit diagram of power storage pack 100 according to Embodiment 1.

Accordingly, in power storage pack 100C, first semiconductor element 2A functions as a switching element that is the same as first semiconductor element 2A in power storage pack 100. In power storage pack 100C, second semiconductor element 2B functions as a switching element that is the same as second semiconductor element 2B in power storage pack 100.

Embodiment 5

Hereinafter, a power storage pack according to Embodiment 5 configured by modifying part of the configuration of power storage pack 100B according to Embodiment 3 will be described.

Power storage pack 100B is configured so that first semiconductor element 2A and second semiconductor element 2B each have two vertical MOS transistors that are first vertical MOS transistor 10 and second vertical MOS transistor 20.

In contrast, the power storage pack according to Embodiment 5 is a configuration example in which a first semiconductor element and a second semiconductor element according to Embodiment 5 each do not include second vertical MOS transistor 20 and include only one vertical MOS transistor that is first vertical MOS transistor 10.

Elements of the power storage pack according to Embodiment 5 which are the same as those of power storage pack 100 are assigned with like reference signs, and detailed description thereof is omitted as having already been explained. The following focuses on the difference between the power storage pack according to Embodiment 5 and power storage pack 100.

(Configuration)

Figure 21:
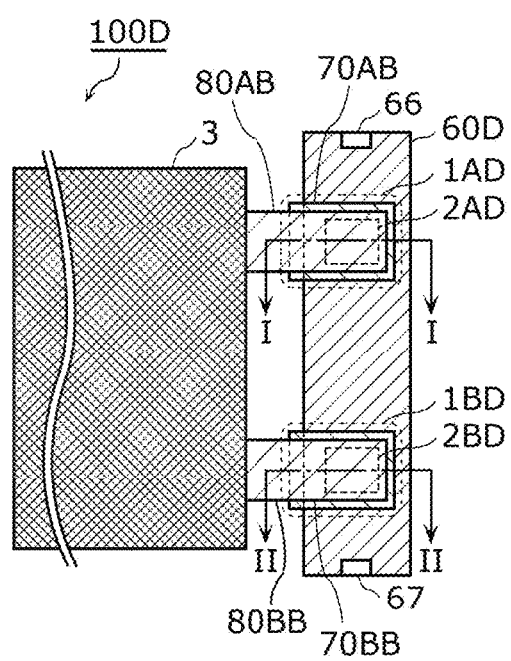
FIG. 21 is a plan view illustrating the configuration of a power storage pack according to Embodiment 5.
Figure 22A:
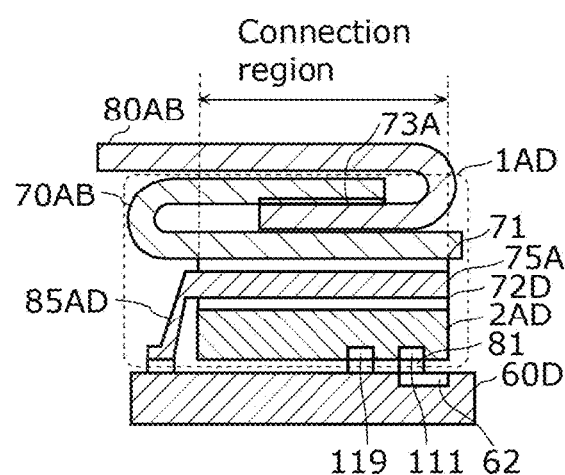
FIG. 22A is a cross-sectional view illustrating the configuration of the power storage pack according to Embodiment 5.
Figure 22B:
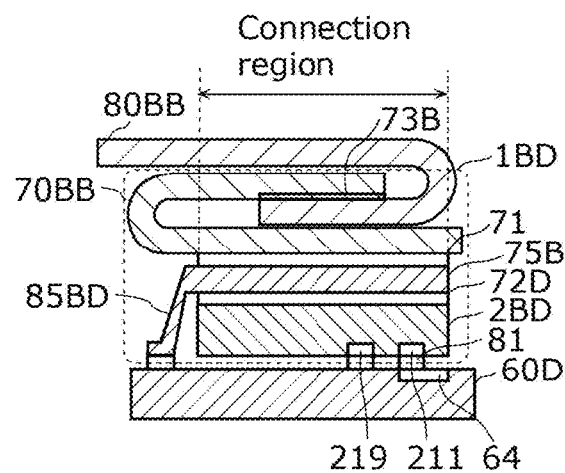
FIG. 22B is a cross-sectional view illustrating the configuration of the power storage pack according to Embodiment 5.

FIG. 21 is a plan view illustrating the configuration of power storage pack 100D according to Embodiment 5. FIG. 22A is a cross-sectional view illustrating a cross section taken at line I-I in FIG. 21. FIG. 22B is a cross-sectional view illustrating a cross section taken at line II-II in FIG. 21. FIG. 21 illustrates, using dotted lines, a part of a portion that cannot actually be directly seen, as if the part of the portion can be seen.

As illustrated in FIG. 21, FIG. 22A, and FIG. 22B, power storage pack 100D is configured by modifying power storage pack 100B according to Embodiment 3 so that first semiconductor device 1AB is changed to first semiconductor device 1AD, second semiconductor device 1BB is changed to second semiconductor device 1BD, and protection circuit substrate 60 is changed to protection circuit substrate 60D.

Protection circuit substrate 60D is configured by removing first wiring 61 and third wiring 63 from protection circuit substrate 60.

First semiconductor device 1AD is configured by modifying first semiconductor device 1AB so that first semiconductor element 2A is changed to first semiconductor element 2AD, insulating material 72 is changed to conductive material 72D (e.g., solder), and metal component 85A is changed to metal component 85AD.

Figure 23:
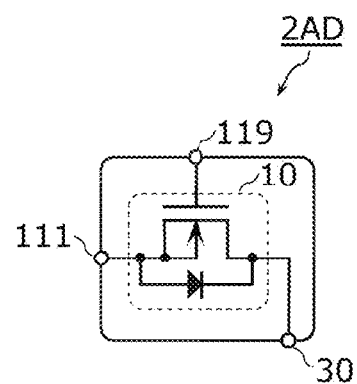
FIG. 23 is a circuit diagram of a first semiconductor element according to Embodiment 5.

FIG. 23 is the circuit diagram of first semiconductor element 2AD.

As illustrated in FIG. 23, first semiconductor element 2AD is configured by removing second gate terminal 129 and second source terminal 121 from first semiconductor element 2A due to the removal of second vertical MOS transistor 20 from first semiconductor element 2A.

Returning back to FIG. 21, FIG. 22A, and FIG. 22B, the description of a configuration for power storage pack 100D continues.

Conductive material 72D connects third metal plate 75A to one main surface of first semiconductor element 2AD. This results in conduction between third metal plate 75A and drain electrode 30. With this, first metal plate 70AB and drain electrode 30 have the same electric potential.

When first semiconductor element 2AD is mounted on mounting substrate 60D, one or more metal components 85AD, like one or more metal components 85A in first semiconductor device 1AB, are mounted on mounting substrate 60D together with first semiconductor element 2AD. In other words, the height of the one or more metal components 85AD from the main surface of third metal plate 75A is equal to the distance from the main surface of third metal plate 75A to the other main surface of first semiconductor element 2AD.

As described above, protection circuit substrate 60D does not include first wiring 61. Accordingly, there is no substrate connection terminal having the same electric potential as first metal plate 70AB.

The configuration of first semiconductor device 1AD does not necessarily need to be limited to include one or more metal components 85AD.

Second semiconductor device 1BD is configured by modifying second semiconductor device 1BB so that second semiconductor element 2B is changed to second semiconductor element 2BD, insulating material 72 is changed to conductive material 72D, and metal component 85B is changed to metal component 85BD.

Second semiconductor device 1BD is the same as first semiconductor device 1AD. In other words, second semiconductor device 1BD is the same as first semiconductor device 1AD in which first semiconductor element 2AD is read as second semiconductor element 2BD, first metal plate for power storage tab joint 70AB is read as second metal plate for power storage tab joint 70BB, and metal component 85AD is read as metal component 85BD.

Second semiconductor element 2BD is the same as first semiconductor element 2AD. In other words, second semiconductor element 2BD is configured by removing second gate terminal 229 and second source terminal 221 from second semiconductor element 2B due to the removal of second vertical MOS transistor 20 from second semiconductor element 2B, and changing drain electrode 30 to drain electrode 31.

As described above, protection circuit substrate 60D does not include third wiring 63. There is therefore no substrate connection terminal having the same electric potential as first metal plate 70BB.

(Observations)

Figure 24:
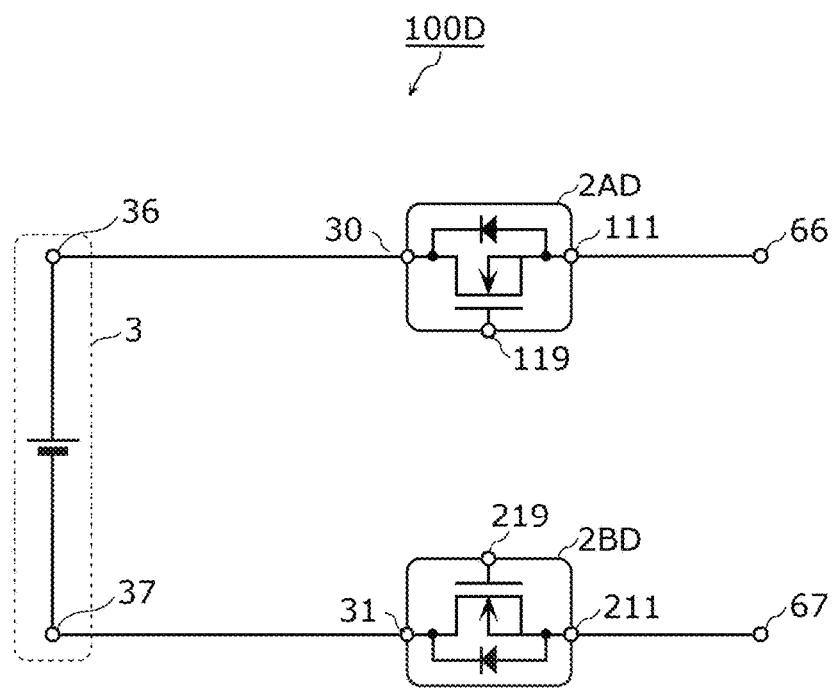
FIG. 24 is a circuit diagram of the power storage pack according to Embodiment 5.

FIG. 24 is the circuit diagram of power storage pack 100D having the above-described configuration.

As illustrated in FIG. 24, first semiconductor element 2AD functions as the switching element of a current path along which current flows from positive electrode terminal 36 of power storage cell 3 to power storage pack positive electrode terminal 66.

In other words, owing to first semiconductor element 2AD, which is a switching element, becoming conductive from drain electrode 30 to first source terminal 111, the electric potential on the drain electrode 30 side becomes higher than the electric potential on the first source terminal 111 side, and this forms a current path along which current flows from power storage cell 3 in order of power storage cell 3, first power storage tab 80AB, first metal plate for power storage tab joint 70AB, and first semiconductor element 2AD.

Second semiconductor element 2BD functions as the switching element of a current path along which current flows from negative electrode terminal 37 of power storage cell 3 to power storage pack negative electrode terminal 67.

In other words, owing to first semiconductor element 2BD, which is a switching element, becoming conductive from drain electrode 31 to first source terminal 211, the electric potential on the drain electrode 31 side becomes higher than the electric potential on the first source terminal 211 side, and this forms a current path along which current flows from power storage cell 3 in order of power storage cell 3, second power storage tab 80BB, first metal plate for power storage tab joint 70BB, and first semiconductor element 2BD.

With this, first semiconductor element 2AD and second semiconductor element 2BD, each of which is a switching element, can control charging or discharging power storage cell 3 in protection circuit substrate 60D.

As illustrated in FIG. 24, power storage pack 100D includes, on the high side of power storage cell 3, first semiconductor element 2AD that is a switching element that controls a current path along which current flows from positive electrode terminal 36 to power storage pack positive electrode terminal 66, and includes, on the low side of power storage cell 3, second semiconductor element 2BD that is a switching element that controls a current path along which current flows from negative electrode terminal 37 to power storage pack negative electrode terminal 67.

With this, power storage pack 100D can achieve the double protection of power storage cell 3 both on the high side and the low side of power storage cell 3.

Figure 25A:
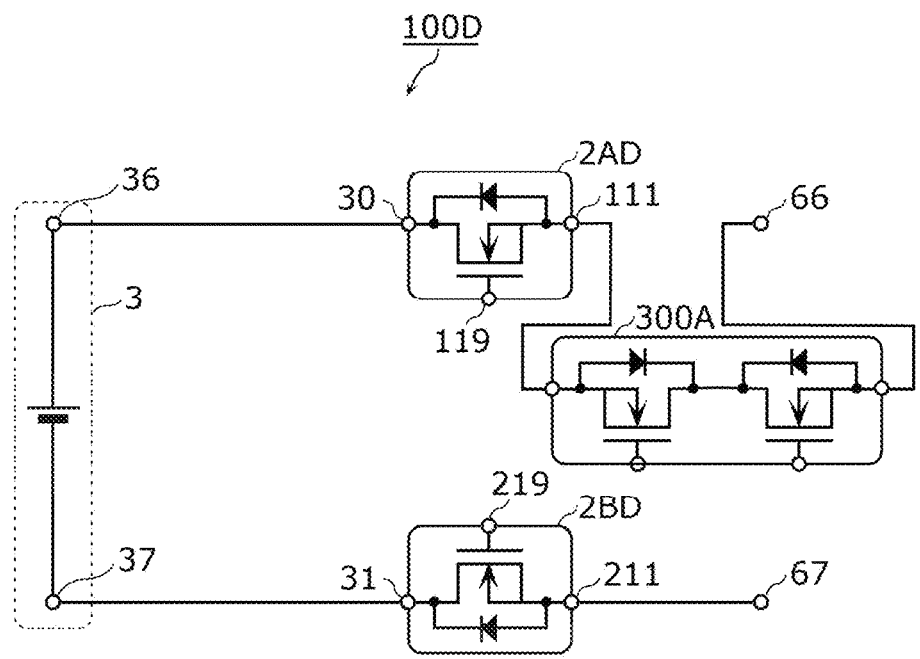
FIG. 25A is a circuit diagram of another configuration of the power storage pack according to Embodiment 5.
Figure 25B:
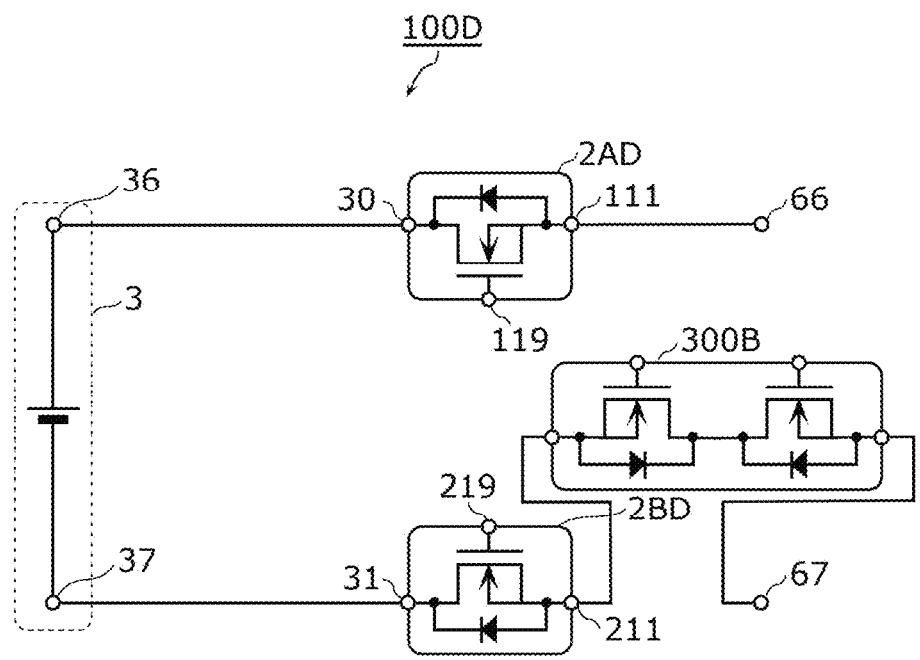
FIG. 25B is a circuit diagram of another configuration of the power storage pack according to Embodiment 5.

Power storage pack 100D can achieve the double protection of power storage cell 3 with a structure further including switching element 300A on the high side of power storage cell 3, as illustrated in FIG. 25A, or with a structure further including switching element 300B on the low side of power storage cell 3, as illustrated in FIG. 25B.

In the case where power storage pack 100D has the configuration illustrated in FIG. 25A, when first power storage tab 80AB is in such a shape that first semiconductor element 2AD is covered and other element can be further covered in the plan view of protection circuit substrate 60D, or when second power storage tab 80BB is in such a shape that second semiconductor element 2BD is covered and other element can be further covered in the plan view of protection circuit substrate 60D, it is possible to reduce the size of protection circuit substrate 60D by disposing switching element 300A where it overlaps first power storage tab 80AB or second power storage tab 80BB in the plan view of protection circuit substrate 60D, compared to when switching element 300A is not disposed in a location where it overlaps first power storage tab 80AB or second power storage tab 80BB in the plan view of protection circuit substrate 60D.

In the case where power storage pack 100D has the configuration illustrated in FIG. 25B, by disposing switching element 300B at a location where protection circuit substrate 60D overlaps first power storage tab 80AB or second power storage tab 80BB in the plan view of protection circuit substrate 60D, it is possible to reduce the size of protection circuit substrate 60D compared with when switching element 300B is not disposed in a location where switching element 300B overlaps first power storage tab 80AB or second power storage tab 80BB in the plan view of protection circuit substrate 60D.

First semiconductor device 1AD may not include third metal plate 75A and the first main surface of first metal plate 70AB may be directly connected to one main surface of first semiconductor element 2AD via conductive material 72D. Second semiconductor device 1BD may not include third metal plate 75B and the first main surface of first metal plate 70BB may be directly connected to one main surface of second semiconductor element 2BD via conductive material 72D.

Variation 1

Hereinafter, a power storage pack according to Variation 1 configured by modifying part of the configuration of power storage pack 100B according to Embodiment 3 will be described.

Power storage pack 100B is configured so that first semiconductor element 2A and second semiconductor element 2B included in power storage pack 100B each have two vertical MOS transistors that are first vertical MOS transistor 10 and second vertical MOS transistor 20.

In contrast, the power storage pack according to Variation 1 is a configuration example in which the power storage pack is configured to include a first semiconductor element and a second semiconductor element according to Variation 1, which are included in the power storage pack according to Variation 1 and each of which has three vertical MOS transistors.

(Configuration)

Figure 26:
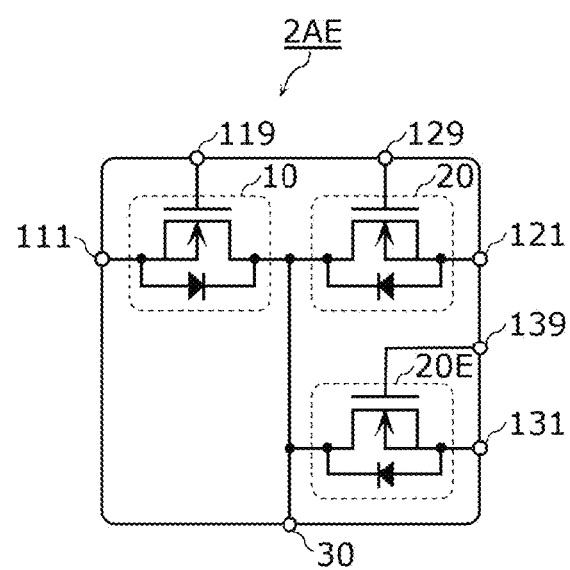
FIG. 26 is a circuit diagram of a first semiconductor element according to Variation 1.
Figure 27:
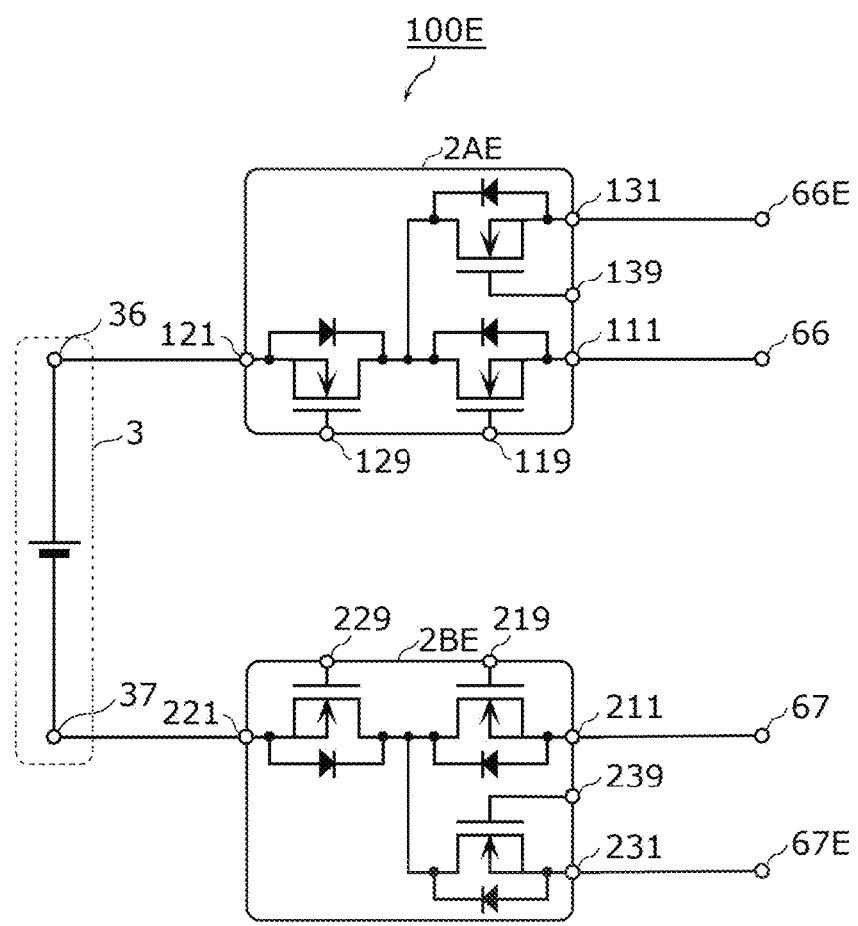
FIG. 27 is a circuit diagram of a power storage pack according to Variation 1.

FIG. 26 is the circuit diagram of first semiconductor element 2AE according to Variation 1 included in power storage pack 100E according to Variation 1 (see FIG. 27).

As illustrated in FIG. 26, first semiconductor element 2AE is configured by further including, in first semiconductor element 2A according to Embodiment 3, third vertical MOS transistor 20E as well as third gate terminal 139 that is the gate terminal of third vertical MOS transistor 20E and third source terminal 131 that is the source terminal of third vertical MOS transistor 20E. In this case, low-concentration impurity layer 33 and semiconductor substrate 32 function as a common drain region sharing the first drain region of first vertical MOS transistor 10, the second drain region of second vertical MOS transistor 20, and the third drain region of third vertical MOS transistor 20E.

Second semiconductor element 2BE according to Variation 1 (see FIG. 27) included in power storage pack 100E is the same as first semiconductor element 2AE. More specifically, second semiconductor element 2BE is the same as first semiconductor element 2AE in which first gate terminal 119 is read as first gate terminal 219, first source terminal 111 is read as first source terminal 211, second gate terminal 129 is read as second gate terminal 229, second source terminal 121 is read as second source terminal 221, third gate terminal 139 is read as third gate terminal 239, and third source terminal 131 is read as third source terminal 231.

FIG. 27 is the circuit diagram of power storage pack 100E according to Variation 1.

As illustrated in FIG. 27, power storage pack 100E is configured by modifying power storage pack 100B according to Embodiment 3 so that first semiconductor element 2A is changed to first semiconductor element 2AE, second semiconductor element 2B is changed to second semiconductor element 2BE, and power storage pack positive electrode terminal 66E and power storage pack negative electrode terminal 67E are added.

Power storage pack positive electrode terminal 66E and power storage pack negative electrode terminal 67E are included in, for example, a protection circuit substrate according to Variation 1 (not shown in the figure) that is configured by adding power storage pack positive electrode terminal 66E and power storage pack negative electrode terminal 67E to protection circuit substrate 60 according to Embodiment 3.

(Observations)

As illustrated in FIG. 27, power storage pack 100E (i) includes, on the high side of power storage cell 3, first semiconductor element 2AE that is a switching element that controls current paths of two systems that are a current path along which current flows from positive electrode terminal 36 to power storage pack positive electrode terminal 66 and a current path along which current flows from power storage pack positive electrode terminal 66 to positive electrode terminal 36, as well as a current path along which current flows from positive electrode terminal 36 to power storage pack positive electrode terminal 66E and a current path along which current flows from power storage pack positive electrode terminal 66E to positive electrode terminal 36, and (ii) includes, on the low side of power storage cell 3, second semiconductor element 2BE that is a switching element that controls current paths of two systems that are a current path along which current flows from negative electrode terminal 37 to power storage pack negative electrode terminal 67 and a current path along which current flows from power storage pack negative electrode terminal 67 to negative electrode terminal 37, as well as a current path along which current flows from negative electrode terminal 37 to power storage pack negative electrode terminal 67E and a current path along which current flows from power storage pack negative electrode terminal 67E to negative electrode terminal 37.

This enables power storage pack 100E to achieve the double protection of power storage cell 3 in each of (i) the two systems on the high side of power storage cell 3 and (ii) the two systems on the low side of power storage cell 3.

Variation 2

Hereinafter, a power storage pack according to Variation 2 configured by modifying part of the configuration of power storage pack 100B according to Embodiment 3 will be described.

Power storage pack 100B is a configuration example in which power storage pack 100B includes, in the plan view of protection circuit substrate 60, first semiconductor element 2A in a location that overlaps first power storage tab 80AB, and includes second semiconductor element 2B in a location that overlaps second power storage tab 80BB.

In contrast, the power storage pack according to Variation 2 is a configuration example in which the power storage pack is configured by modifying power storage pack 100B to also (i) include, in addition to first semiconductor element 2A, a third semiconductor element according to Variation 2 in a location that overlaps first power storage tab 80AB, and (ii) include, in addition to second semiconductor element 2B, a fourth semiconductor element according to Variation 2 in a location that overlaps second power storage tab 80BB, in the plan view of the protection circuit substrate according to Variation 2 included in the power storage pack according to Variation 2.

Figure 28:
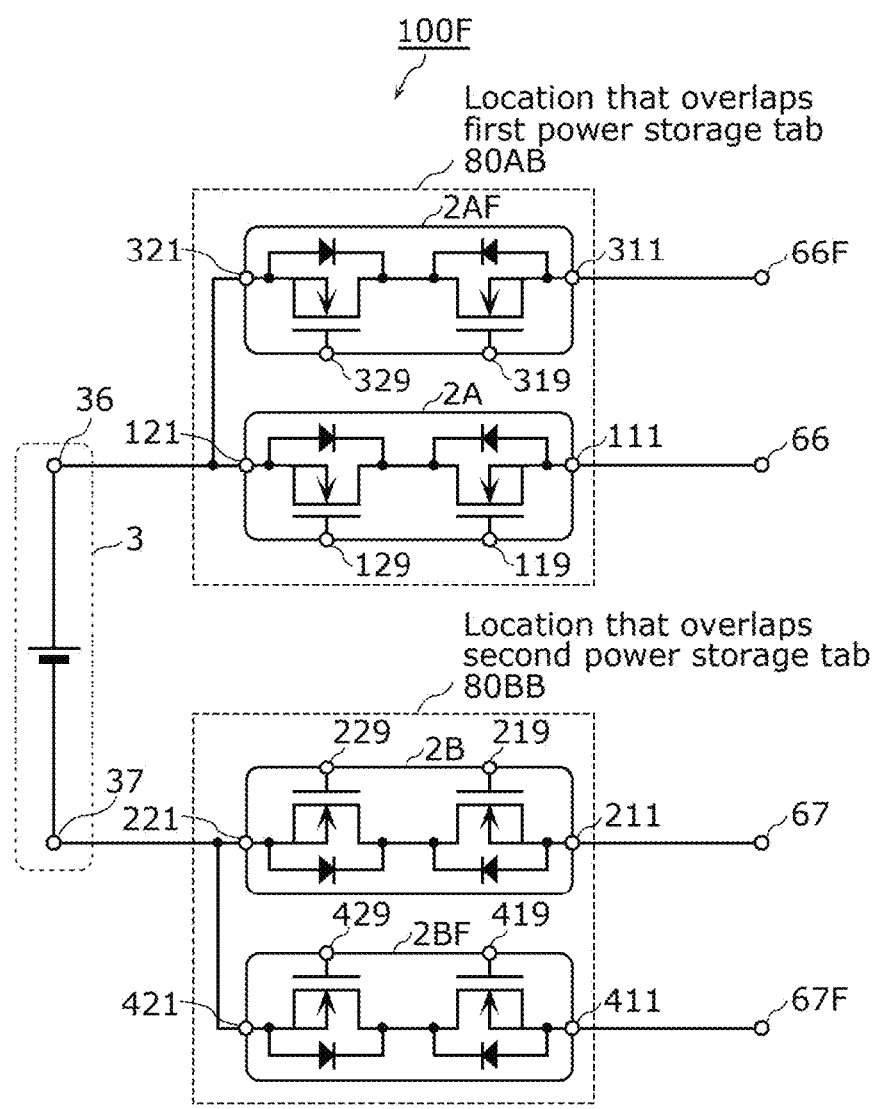
FIG. 28 is a circuit diagram of a power storage pack according to Variation 2.

FIG. 28 is the circuit diagram of power storage pack 100F according to Variation 2.

As illustrated in FIG. 28, power storage pack 100F is configured by modifying power storage pack 100B according to Embodiment 3 so that power storage pack positive electrode terminal 66F, power storage pack negative electrode terminal 67F, third semiconductor element 2AF that is disposed in a location that overlaps first power storage tab 80AB in the plan view of the protection circuit substrate according to Variation 2 (not shown in the figure), and fourth semiconductor element 2BF that is disposed in a location that overlaps second power storage tab 80BB in the plan view of the protection circuit substrate according to Variation 2 (not shown in the figure) are added.

Power storage pack positive electrode terminal 66F and power storage pack negative electrode terminal 67F are included in, for example, the protection circuit substrate according to Variation 2 configured by modifying protection circuit substrate 60 according to Embodiment 3 so that power storage pack positive electrode terminal 66F and power storage pack negative electrode terminal 67F are added.

Third semiconductor element 2AF is the same as first semiconductor element 2A. More specifically, third semiconductor element 2AF is the same as first semiconductor element 2A in which first gate terminal 119 is read as first gate terminal 319, first source terminal 111 is read as first source terminal 311, second gate terminal 129 is read as second gate terminal 329, and second source terminal 121 is read as second source terminal 321.

Fourth semiconductor element 2BF is the same as first semiconductor element 2A. More specifically, fourth semiconductor element 2BF is the same as first semiconductor element 2A in which first gate terminal 119 is read as first gate terminal 419, first source terminal 111 is read as first source terminal 411, second gate terminal 129 is read as second gate terminal 429, and second source terminal 121 is read as second source terminal 421.

(Observations)

As illustrated in FIG. 28, power storage pack 100F includes, on the high side of power storage cell 3: first semiconductor element 2A which is a switching element that controls a current path along which current flows from positive electrode terminal 36 to power storage pack positive electrode terminal 66, and a current path along which current flows from power storage pack positive electrode terminal 66 to positive electrode terminal 36; and third semiconductor element 2AF which is a switching element that controls a current path along which current flows from positive electrode terminal 36 to power storage pack positive electrode terminal 66F, and a current path along which current flows from power storage pack positive electrode terminal 66F to positive electrode terminal 36, and includes, on the low side of power storage cell 3: second semiconductor element 2B which is a switching element that controls a current path along which current flows from negative electrode terminal 37 to power storage pack negative electrode terminal 67, and a current path along which current flows from power storage pack negative electrode terminal 67 to negative electrode terminal 37; and fourth semiconductor element 2BF which is a switching element that controls a current path along which current flows from negative electrode terminal 37 to power storage pack negative electrode terminal 67F, and a current path along which current flows from power storage pack negative electrode terminal 67F to negative electrode terminal 37.

This enables power storage pack 100F to achieve the double protection of power storage cell 3 in each of (i) two systems on the high side of power storage cell 3 and (ii) two systems on the low side of power storage cell 3.

In addition, with power storage pack 100F, it is possible to reduce the size of the protection circuit substrate according to Variation 2 compared with when, in the plan view of the protection circuit substrate according to Variation 2, third semiconductor element 2AF is not disposed in the location that overlaps first power storage tab 80AB, and fourth semiconductor element 2BF is not disposed in the location that overlaps first power storage tab 80AB.
Variation 3

Hereinafter, a power storage pack according to Variation 3 configured by modifying part of the configuration of power storage pack 100D according to Embodiment 5 will be described.

Power storage pack 100D is a configuration example in which power storage pack 100D includes power storage cell 3, first semiconductor element 2AD, and second semiconductor element 2BD.

In contrast, the power storage pack according to Variation 3 is a configuration example obtained by modifying power storage pack 100D to also include a power storage cell according to Variation 3 that is the same as power storage cell 3, a third semiconductor element according to Variation 3 that is the same as first semiconductor element 2AD, and a fourth semiconductor element according to Variation 3 that is the same as second semiconductor element 2BD.
(Configuration)

Figure 29:
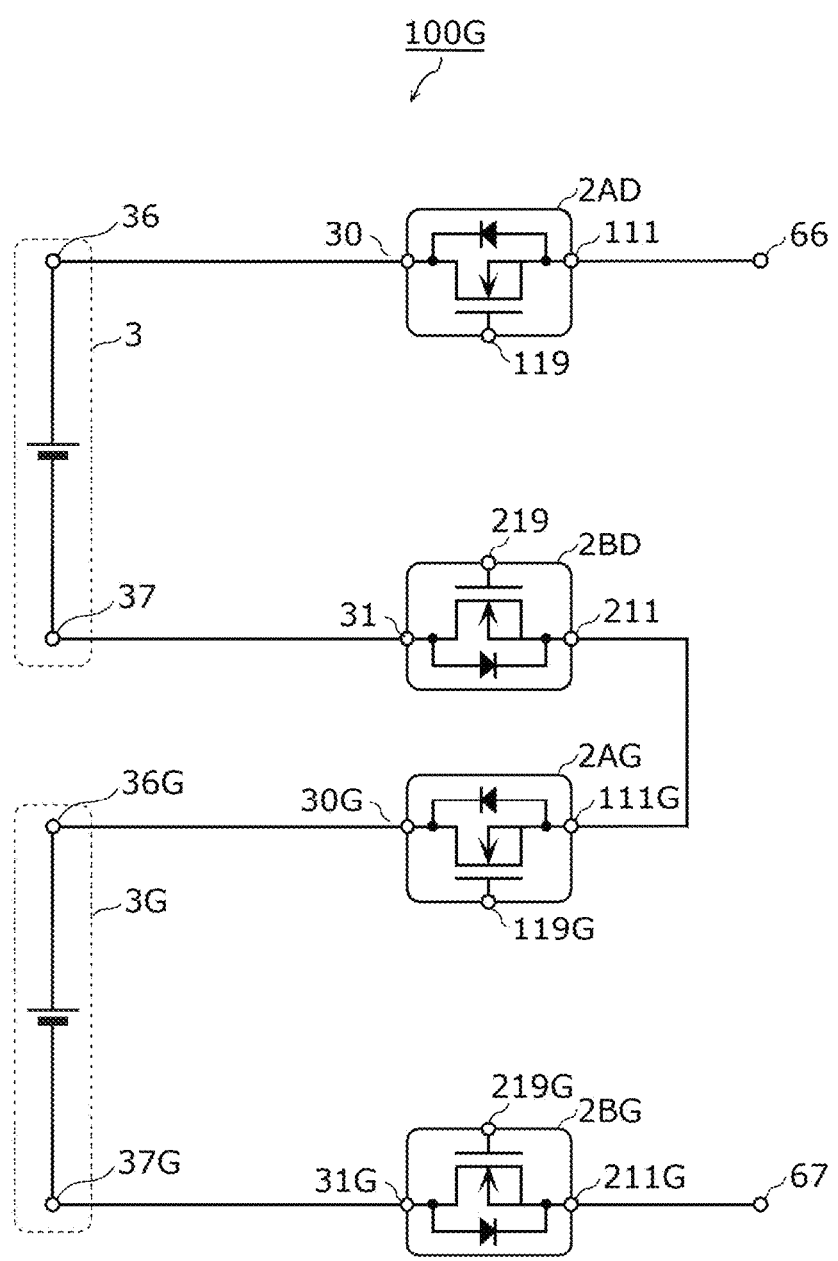
FIG. 29 is a circuit diagram of a power storage pack according to Variation 3.

FIG. 29 is the circuit diagram of power storage pack 100G according to Variation 3.

As illustrated in FIG. 29, power storage pack 100G is configured by modifying power storage pack 100D according to Embodiment 5 to include power storage cell 3G, third semiconductor element 2AG, and fourth semiconductor element 2BG.

Power storage cell 3G is the same as power storage cell 3. More specifically, power storage cell 3G is the same as power storage cell 3 in which positive electrode terminal 36 is read as positive electrode terminal 36G and negative electrode terminal 37 is read as negative electrode terminal 37G.

Third semiconductor element 2AG is the same as first semiconductor element 2AD. More specifically, third semiconductor element 2AG is the same as first semiconductor element 2AD in which first gate terminal 119 is read as first gate terminal 119G, first source terminal 111 is read as first source terminal 111G, and drain electrode 30 is read as drain electrode 30G.

Fourth semiconductor element 2BG is the same as second semiconductor element 2BD. More specifically, fourth semiconductor element 2BG is the same as second semiconductor element 2BD in which first gate terminal 219 is read as first gate terminal 219G, first source terminal 211 is read as first source terminal 211G, and drain electrode 31 is read as drain electrode 31G.

As illustrated in FIG. 29, first semiconductor element 2AD, power storage cell 3, second semiconductor element 2BD, third semiconductor element 2AG, power storage cell 3G, and fourth semiconductor element 2BG are connected in series in this order between power storage pack positive electrode terminal 66 and power storage pack negative electrode terminal 67.

(Observations)

According to power storage pack 100G having the above-described configuration, it is possible to achieve both double protection of power storage cell 3 and double protection of power storage cell 3G.

Embodiment 6

Hereinafter, a power storage pack according to Embodiment 6 configured by modifying part of the configuration of power storage pack 100C according to Embodiment 4 will be described.

Power storage pack 100C is a configuration example in which power storage pack 100C includes first semiconductor element 2A on the high side of power storage cell 3 and second semiconductor element 2B on the low side of power storage cell 3.

In contrast, the power storage pack according to Embodiment 6 is a configuration example in which the power storage pack according to Embodiment 6 includes first semiconductor element 2A and second semiconductor element 2B on the low side of power storage cell 3.

Elements of the power storage pack according to Embodiment 6 which are the same as those of power storage pack 100C are assigned with like reference signs, and detailed description thereof is omitted as having already been explained. The following focuses on the difference between the power storage pack according to Embodiment 6 and power storage pack 100C.
(Configuration)

Figure 30:
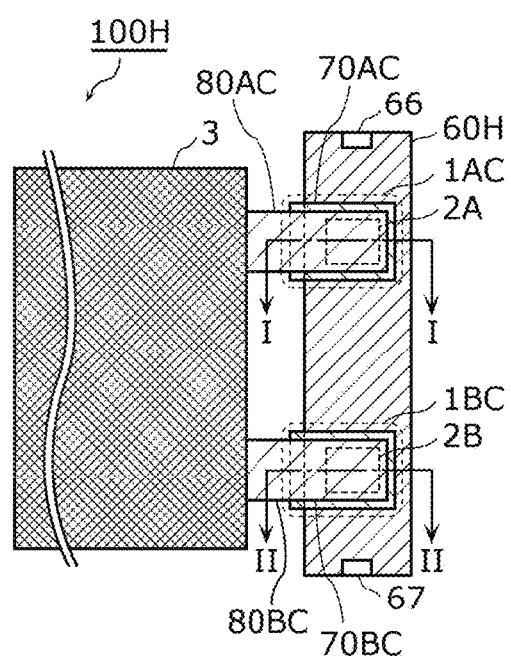
FIG. 30 is a plan view illustrating the configuration of a power storage pack according to Embodiment 6.
Figure 31A:
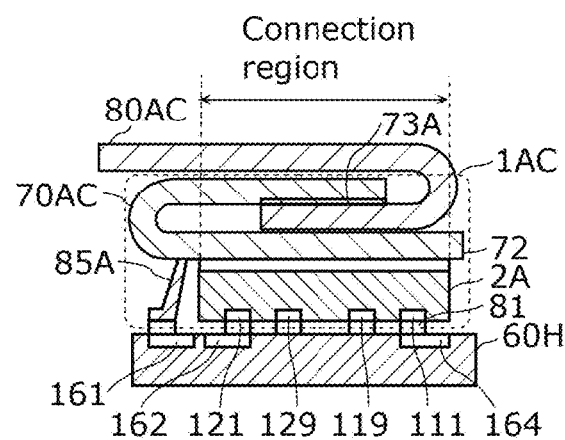
FIG. 31A is a cross-sectional view illustrating the configuration of the power storage pack according to Embodiment 6.
Figure 31B:
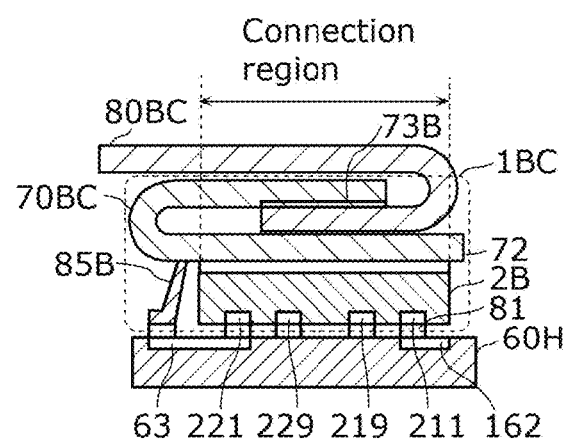
FIG. 31B is a cross-sectional view illustrating the configuration of the power storage pack according to Embodiment 6.

FIG. 30 is a plan view illustrating the configuration of power storage pack 100H according to Embodiment 6. FIG. 31A is a cross-sectional view illustrating a cross section taken at line I-I in FIG. 30. FIG. 31B is a cross-sectional view illustrating a cross section taken at line II-II in FIG. 30. FIG. 30 illustrates, using dotted lines, a part of a portion that cannot actually be directly seen, as if the part of the portion can be seen.

As illustrated in FIG. 30, FIG. 31A, and FIG. 31B, power storage pack 100H is configured by modifying power storage pack 100C according to Embodiment 4 so that protection circuit substrate 60 is changed to protection circuit substrate 60H.

Protection circuit substrate 60H is configured by modifying protection circuit substrate 60 according to Embodiment 4 so that first wiring 61 is changed to first wiring 161, second wiring 62 is changed to second wiring 162, and fourth wiring 64 is changed to fourth wiring 164.

First wiring 161 is connected to power storage pack positive electrode terminal 66, and is also connected to at least one of one or more metal components 85A via conductive material 81.

Accordingly, in the plan view of protection circuit substrate 60H, power storage pack 100H includes a portion in which a region in which current flows between first power storage tab 80AC and protection circuit substrate 60H overlaps a region in which first semiconductor element 2A overlaps first power storage tab 80AC with first metal plate for power storage tab joint 70AC interposed therebetween.

Second wiring 162 is connected, via conductive material 81, to second source terminal 121 and first source terminal 211.

Fourth wiring 164 is connected to power storage pack negative electrode terminal 67, and is also connected to first source terminal 111 via conductive material 81.
(Observations)

Figure 32:
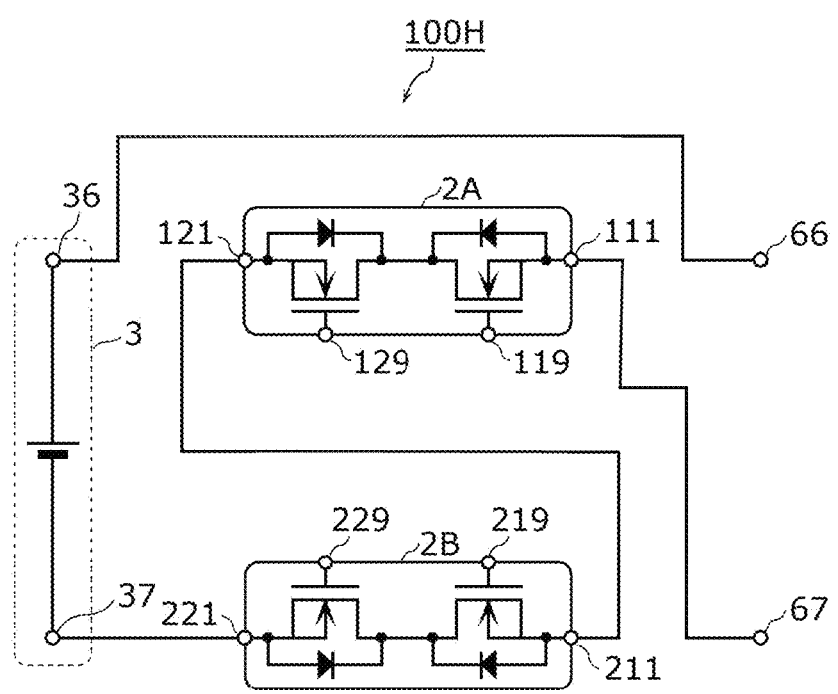
FIG. 32 is a circuit diagram of the power storage pack according to Embodiment 6.

FIG. 32 is the circuit diagram of power storage pack 100H having the above-described configuration.

As illustrated in FIG. 32, first semiconductor element 2A and second semiconductor element 2B each function as the switching element of a current path along which current flows from negative electrode terminal 37 of power storage cell 3 to power storage pack negative electrode terminal 67 and a current path along which current flows from power storage pack negative electrode terminal 67 to negative electrode terminal 37 of power storage cell 3.

In other words, (1) by increasing the electric potential on the second source terminal 221 side to be higher than the electric potential on the first source terminal 111 side owing to first semiconductor element 2A, which is a switching element, becoming conductive from second source terminal 121 to first source terminal 111 and owing to first semiconductor element 2B, which is a switching element, becoming conductive from second source terminal 221 to first source terminal 211, a current path along which current flows from power storage cell 3 in order of power storage cell 3, second power storage tab 80BC, second metal plate for power storage tab joint 70BC, second semiconductor element 2B, second wiring 162 of protection circuit substrate 60H, first semiconductor element 2A, and fourth wiring 164 of protection circuit substrate 60H is formed, and (2) by increasing the electric potential on the first source terminal 111 side to be higher than the electric potential on the second source terminal 221 side owing to first semiconductor element 2A, which is a switching element, becoming conductive from first source terminal 111 to second source terminal 121 and owing to second semiconductor element 2B, which is a switching element, becoming conductive from first source terminal 211 to second source terminal 221, a current path along which current flows from fourth wiring 164 of protection circuit substrate 60H in order of fourth wiring 164 of protection circuit substrate 60H, first semiconductor element 2A, second wiring 162 of protection circuit substrate 60H, second semiconductor element 2B, second metal plate for power storage tab joint 70BC, second power storage tab 80BC, and power storage cell 3 is formed.

First semiconductor element 2A and second semiconductor element 2B, each of which is a switching element, can therefore control charging or discharging of power storage cell 3 in protection circuit substrate 60H.

As illustrated in FIG. 32, power storage pack 100H includes, on the low side of power storage cell 3, first semiconductor element 2A and second semiconductor element 2B each of which is a switching element that controls a current path along which current flows from negative electrode terminal 37 to power storage pack negative electrode terminal 67 and a current path along which current flows from power storage pack negative electrode terminal 67 to negative electrode terminal 37.

This enables power storage pack 100H to achieve the double protection of power storage cell 3 on the low side of power storage cell 3.

Embodiment 7

Hereinafter, a semiconductor device manufacturing method to be used when manufacturing first semiconductor device 1AB mounted on mounting substrate 60 will be described.

FIG. 33A through FIG. 33F are each a cross-sectional view of first semiconductor device 1AB in the middle of manufacture in each process performed in the semiconductor device manufacturing method.

Figure 33A:
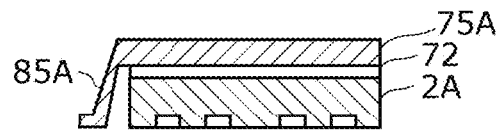
FIG. 33A is a cross-sectional view of a first semiconductor device in the middle of manufacture in the zeroth process of a semiconductor device manufacturing method.
Figure 33B:
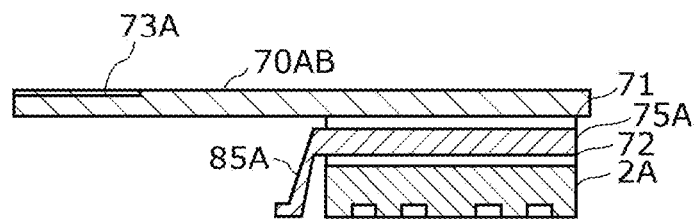
FIG. 33B is a cross-sectional view of the first semiconductor device in the middle of manufacture in the first process of the semiconductor device manufacturing method.
Figure 33C:
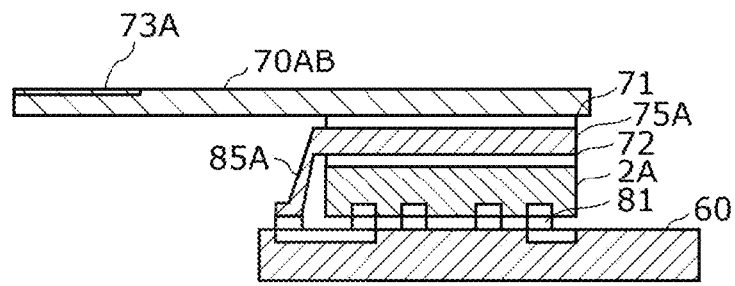
FIG. 33C is a cross-sectional view of the first semiconductor device in the middle of manufacture in the second process of the semiconductor device manufacturing method.
Figure 33D:
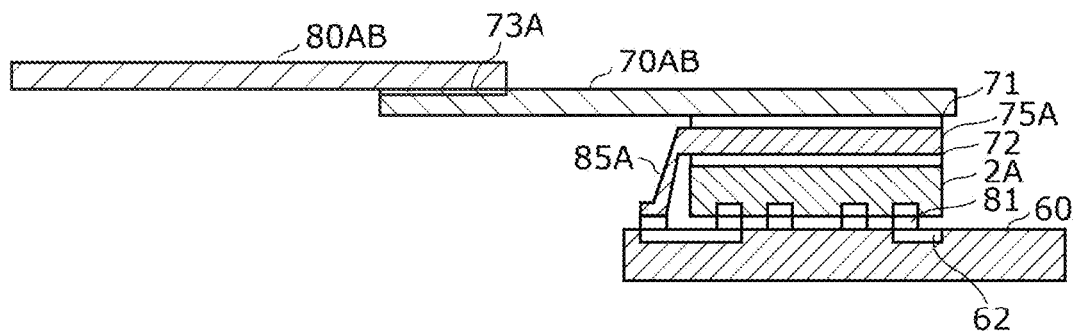
FIG. 33D is a cross-sectional view of the first semiconductor device in the middle of manufacture in the third process of the semiconductor device manufacturing method.
Figure 33E:
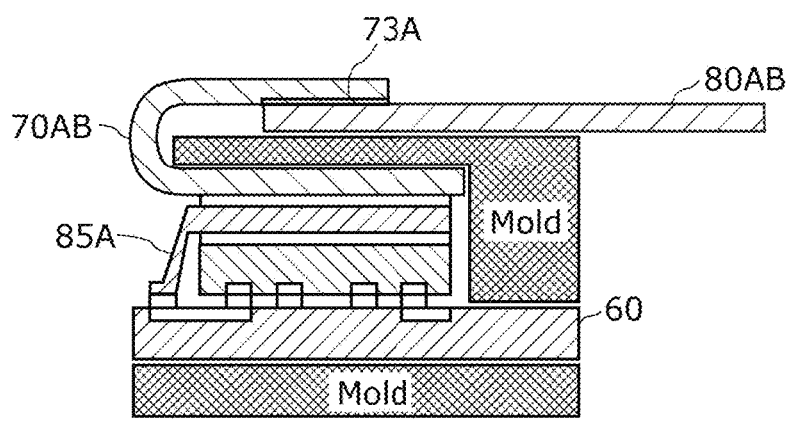
FIG. 33E is a cross-sectional view of the first semiconductor device in the middle of manufacture in the fourth process of the semiconductor device manufacturing method.
Figure 33F:
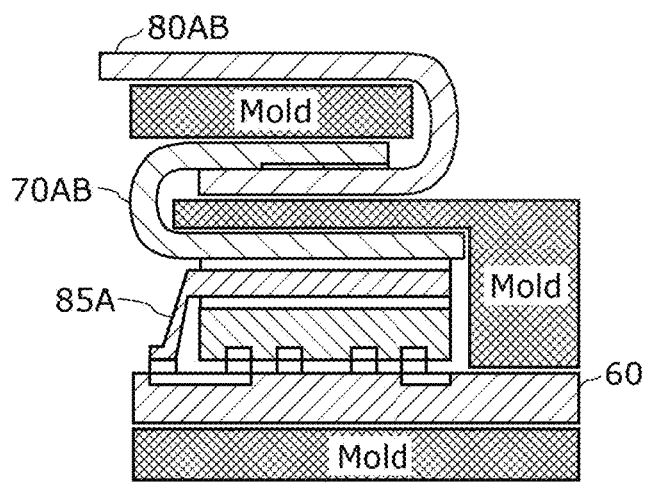
FIG. 33F is a cross-sectional view of the first semiconductor device in the middle of manufacture in the fifth process of the semiconductor device manufacturing method.

As illustrated in FIG. 33A through FIG. 33F, the semiconductor device manufacturing method includes six processes of the zeroth process illustrated in FIG. 33A, the first process illustrated in FIG. 33B, the second process illustrated in FIG. 33C, the third process illustrated in FIG. 33D, the fourth process illustrated in FIG. 33E, and the fifth process illustrated in FIG. 33F. As will be described later, a semiconductor device manufacturing method that does not include the zeroth process and includes five processes of the first through fifth processes is used when manufacturing first semiconductor device 1AC mounted on mounting substrate 60.

Hereinafter, each of the processes will be described in order.

The zeroth process is a process to be performed at first.

As illustrated in FIG. 33A, the zeroth process is a process of connecting third metal plate 75A including one or more metal components 85A to first semiconductor element 2A. When manufacturing first semiconductor device 1AC mounted on mounting substrate 60, this zeroth process is not performed.

The first process is a process to be performed after the zeroth process, or performed first, omitting the zeroth process.

As illustrated in FIG. 33B, the first process is a process of connecting first semiconductor element 2A to the first main surface of first metal plate 70AB. In the case of performing the first process after the zeroth process, first semiconductor element 2A is connected to the first main surface via third metal plate 75A. In the case of omitting the zeroth process and performing the first process at first, i.e., in the case of manufacturing first semiconductor device 1AC mounted on mounting substrate 60, first semiconductor element 2A is connected to the first main surface without third metal plate 75A.

The second process is a process to be performed after the first process has been performed.

As illustrated in FIG. 33C, the second process is a process of mounting first semiconductor element 2A on mounting substrate 60.

The second process may be performed before the first process in the manufacturing method.

The third process is a process to be performed after the second process has been performed.

As illustrated in FIG. 33D, the third process is a process of joining second metal plate 80AB to the second main surface on an opposite side of the first main surface of first metal plate 70AB.

The fourth process, is a process to be performed together with the fifth process to be described later in no particular order after the third process has been performed.

As illustrated in FIG. 33E, the fourth process is a process of bending first metal plate 70AB so that (1) first metal plate 70AB includes a portion in which second main surfaces face each other and (2) in the plan view of first semiconductor element 2A, first metal plate 70AB includes a portion in which a region in which first metal plate 70AB is connected to first semiconductor element 2A overlaps a region in which first metal plate 70AB is joined to second metal plate 80AB with first metal plate 70AB interposed therebetween.

As illustrated in FIG. 33E, first metal plate 70AB may be bent using, for example, a mold in the fourth process.

The fifth process is a process to be performed together with the fourth process in no particular order after the third process has been performed.

As illustrated in FIG. 33F, the fifth process is a process of bending second metal plate 80AB to include a portion in which planes to be joined to first metal plate 70AB face each other.

As illustrated in FIG. 33F, second metal plate 80AB may be bent using, for example, a mold in the fifth process.

(Supplementary Notes)

Although the storage pack, semiconductor device, and semiconductor device manufacturing method according to one aspect of the present disclosure have been described based on Embodiments 1 through 7 and Variations 1 through 3, the present disclosure is not limited to these Embodiments and Variations. Other embodiments obtained by various modifications of the embodiments that may be conceived by persons skilled in the art, as well as embodiments resulting from combinations of elements from different embodiments and variations that do not depart from the essence of the present disclosure may be also included in the range of one or more aspects of the present disclosure.

(1) In Embodiment 6, first metal plate for power storage tab joint 70AC is bent and power storage pack 100H includes, in the plan view of protection circuit substrate 60H, a portion in which a region in which current may flow between first power storage tab 80AC and protection circuit substrate 60H overlaps a region in which first power storage tab 80AC, first metal plate for power storage tab joint 70AC, first semiconductor element 2A, and protection circuit substrate 60H overlap each other, as described above.

However, although first metal plate for power storage tab joint 70AC is not bent, power storage pack 100H can be configured to include a portion in which a region along which current may flow between first power storage tab 80AC and protection circuit substrate 60H overlaps a region in which first power storage tab 80AC, first metal plate for power storage tab joint 70AC, first semiconductor element 2A, and protection circuit substrate 60H overlap each other in the plan view of protection circuit substrate 60H.

Figure 34:
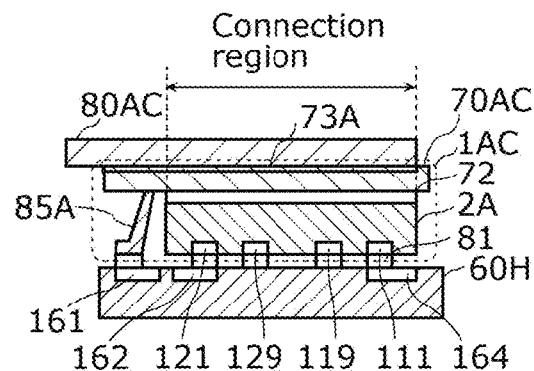
FIG. 34 is a cross-sectional view illustrating another configuration of the power storage pack according to Embodiment 6.

FIG. 34 is a cross-sectional view illustrating one example of how power storage pack 100H including first metal plate for power storage tab joint 70AC and first power storage tab 80AC that are not bent includes a portion in which a region in which current may flow between first power storage tab 80AC and protection circuit substrate 60H overlaps a region in which first power storage tab 80AC, first metal plate for power storage tab joint 70AC, first semiconductor element 2A, and protection circuit substrate 60H overlap each other in the plan view of protection circuit substrate 60H.

Power storage pack 100H having the configuration illustrated in FIG. 34 is a configuration example in which joint preparation region 73A includes a portion in which joint preparation region 73A overlaps a connection region in which first metal plate 70AC is connected to first semiconductor element 2A in the plan view of first metal plate 70AC. However, a configuration example in which joint preparation region 73A does not include the portion in which joint preparation region 73A overlaps the connection region in the plan view of first metal plate 70AC is also conceivable.

(2) In Embodiment 3, power storage pack 100B is described as a configuration example in which first metal plate for power storage tab joint 70AB and second metal plate for power storage tab joint 70BB are each bent once, as illustrated in FIG. 18A and FIG. 18B.

However, as another configuration example, power storage pack 100B may be configured so that first metal plate for power storage tab joint 70AB and second metal plate for power storage tab joint 70BB are each bent at least twice.

Figure 35A:
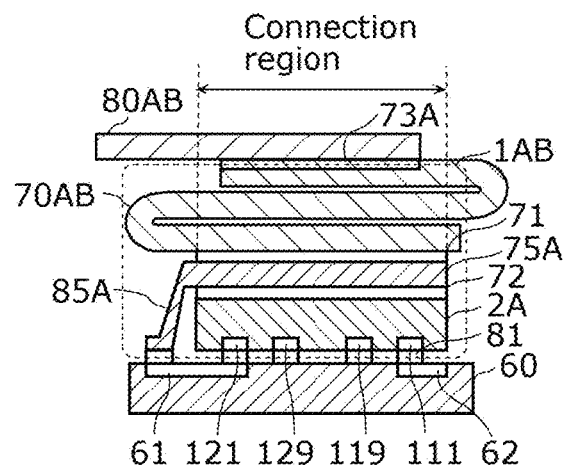
FIG. 35A is a cross-sectional view illustrating another configuration of the power storage pack according to Embodiment 3.
Figure 35B:
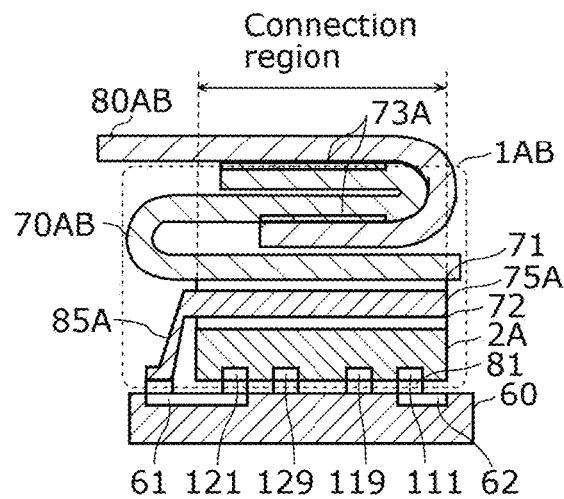
FIG. 35B is a cross-sectional view illustrating another configuration of the power storage pack according to Embodiment 3.

FIG. 35A and FIG. 35B are each a cross-sectional view illustrating a cross section taken at line I-I in FIG. 17 when power storage pack 100B according to Embodiment 3 is configured so that first metal plate for power storage tab joint 70AB and second metal plate for power storage tab joint 70BB are each bent at least two times.

As illustrated in FIG. 35A, power storage pack 100B according to Embodiment 3 may be configured so that first metal plate for power storage tab joint 70AB and second metal plate for power storage tab joint 70BB are each bent two times while first power storage tab 80AB and second power storage tab 80BB are not bent.

Since this can relatively increase the surface areas of first metal plate for power storage tab joint 70AB and second metal plate for power storage tab joint 70BB, heat dissipation effect owing to first metal plate for power storage tab joint 70AB and second metal plate for power storage tab joint 70BB can be relatively increased.

Alternatively, power storage pack 100B according to Embodiment 3 may be configured so that first metal plate for power storage tab joint 70AB and second metal plate for power storage tab joint 70BB are each bent two times and first power storage tab 80AB and second power storage tab 80BB are each bent one time, as illustrated in FIG. 35B.

With this, since first metal plate for power storage tab joint 70AB can be joined to first power storage tab 80AB (e.g., joined by welding) at several locations and second metal plate for power storage tab joint 70BB can be joined to second power storage tab 80BB (e.g., joined by welding) at several locations, a bonding strength between first metal plate for power storage tab joint 70AB and first power storage tab 80AB and a bonding strength between second metal plate for power storage tab joint 70BB and second power storage tab 80BB can be further increased. In addition, since this can relatively increase the surface areas of first metal plate for power storage tab joint 70AB and second metal plate for power storage tab joint 70BB, heat dissipation effect owing to first metal plate for power storage tab joint 70AB and second metal plate for power storage tab joint 70BB can be relatively increased.

(3) Although Embodiment 2 describes power storage pack 100A in which first power storage tab 80A is connected to first semiconductor element 2A via first metal plate for power storage tab joint 70A and second power storage tab 80B is connected to second semiconductor element 2B via second metal plate for power storage tab joint 70B, power storage pack 100A may include neither first metal plate for power storage tab joint 70A nor second metal plate for power storage tab joint 70B, first power storage tab 80A may be connected to first semiconductor element 2A without first metal plate for power storage tab joint 70A, and second power storage tab 80B may be connected to second semiconductor element 2B without second metal plate for power storage tab joint 70B, as another configuration example.

INDUSTRIAL APPLICABILITY

The present disclosure can be widely used in, for instance, a power storage pack, a semiconductor device including a power storage pack, and a semiconductor device manufacturing method of manufacturing the semiconductor device.

The invention claimed is:

1. A semiconductor device comprising:
   a semiconductor element of chip-size package type including a plurality of external connection terminals; and
   a first metal plate including a portion whose thickness is at most 0.2 mm, wherein
   the semiconductor element includes one main surface to which the first metal plate is connected, the semiconductor element includes an other main surface that includes a substrate connection terminal to be connected to a mounting substrate on which the semiconductor element is mounted, the other main surface and the one main surface facing in opposite directions, the substrate connection terminal being included in the plurality of external connection terminals, the first metal plate includes a first main surface connected to the semiconductor element and a second main surface on which a joint preparation region for joining the first metal plate and a second metal plate is provided, the second main surface and the first main surface facing in opposite directions, in a plan view of the first metal plate, the joint preparation region does not overlap a connection region in which the first metal plate is connected to the semiconductor element, the first metal plate has a same electric potential as at least one of the plurality of external connection terminals, the first metal plate is bendable at the portion whose thickness is at most 0.2 mm to include a portion in which second main surfaces face each other, the semiconductor device further comprises one or more metal components to be mounted together with the semiconductor element on the mounting substrate when the semiconductor element is mounted on the mounting substrate, and in the plan view of the first metal plate, each of regions in which the first main surface is connected to the one or more metal components does not overlap the joint preparation region.

2. The semiconductor device according to claim 1, wherein
the one or more metal components include a same material as the first metal plate, and
the one or more metal components and the first metal plate are integrated into one body.

3. The semiconductor device according to claim 1, wherein
the first metal plate is bent to include the portion in which the second main surfaces face each other, and
in a plan view of the semiconductor element, there is a portion in which the semiconductor element overlaps the joint preparation region with the first metal plate interposed therebetween.

4. The semiconductor device according to claim 1, wherein
the semiconductor element is face-down mounted on the mounting substrate via the substrate connection terminal, and
the first metal plate is joined to the second metal plate in the joint preparation region.

5. The semiconductor device according to claim 3, wherein
the semiconductor element is face-down mounted on the mounting substrate via the substrate connection terminal,
the first metal plate is joined to the second metal plate in the joint preparation region,
the second metal plate is bent to include a portion in which planes to be joined to the first metal plate face each other with the first metal plate interposed therebetween,
in a plan view of the mounting substrate, there is an overlap portion in which the second metal plate, the first metal plate, the semiconductor element, and the mounting substrate overlap each other, and in the plan view of the mounting substrate, there is a portion in which a region through which current possibly flows between the second metal plate and the mounting substrate overlaps the overlap portion.

6. A power storage pack comprising the semiconductor device, the second metal plate, and the mounting substrate according to claim 5, and a power storage cell, wherein
the second metal plate is a power storage tab connected to the power storage cell and serves as a conduction path for charging or discharging the power storage cell,
the first metal plate is a metal plate for power storage tab joint which is to be joined to the power storage tab,
the mounting substrate is a protection circuit substrate that protects the power storage cell from overcharge or overdischarge, and
the conduction path is formed from the power storage cell in order of the power storage cell, the power storage tab, the metal plate for power storage tab joint, and the semiconductor element, or in reverse order.

7. The power storage pack according to claim 6, wherein
the one or more metal components are connected to the protection circuit substrate.

8. The power storage pack according to claim 7, wherein
in the plan view of the semiconductor element, the semiconductor element is rectangular in shape and includes two sides that are parallel to a longitudinal direction of the protection circuit substrate, and
the one or more metal components include two metal components disposed to face each other at a full length of at least the two sides along the two sides.

9. The power storage pack according to claim 7, wherein
in the plan view of the semiconductor element, the semiconductor element is rectangular in shape and includes two sides that are perpendicular to a longitudinal direction of the protection circuit substrate, and
the one or more metal components include two metal components disposed to face each other at a full length of at least the two sides along the two sides.

10. The power storage pack according to claim 7, wherein
in the plan view of the semiconductor element, the semiconductor element is rectangular in shape, and
the one or more metal components include four metal components disposed in the vicinity of four corners of the semiconductor element.

11. The power storage pack according to claim 6, wherein
the semiconductor element is a switching element, and
the switching element controls the charging or discharging the power storage cell in the protection circuit substrate.

12. The power storage pack according to claim 11, wherein
in the plan view of the switching element, the switching element includes, on the other main surface side, a plurality of regions that divide the switching element and include a first region and a second region adjacent to each other,
the switching element further includes:
a first vertical MOS transistor in the first region; and
a second vertical MOS transistor in the second region,
the substrate connection terminal comprises a plurality of substrate connection terminals,
on the other main surface of the switching element, the first vertical MOS transistor includes: a first source terminal that is the substrate connection terminal; and a first gate terminal that is the substrate connection terminal and controls a conduction state of the first vertical MOS transistor, on the other main surface of the switching element, the second vertical MOS transistor includes: a second source terminal that is the substrate connection terminal; and a second gate terminal that is the substrate connection terminal and controls a conduction state of the second vertical MOS transistor, on the one main surface of the switching element, the switching element further includes a drain electrode shared between the first vertical MOS transistor and the second vertical MOS transistor, the drain electrode is connected to the metal plate for power storage tab joint via a dielectric adhesive component, and at least one of the one or more metal components is connected only to the first source terminal among the plurality of substrate connection terminals via wiring on the protection circuit substrate.

13. The power storage pack according to claim 11, wherein the substrate connection terminal comprises a plurality of substrate connection terminals, the switching element is a vertical MOS transistor that (i) includes, on the other main surface of the switching element, a source terminal and a gate terminal each of which is the substrate connection terminal, and (ii) includes, on the one main surface of the switching element, a drain electrode that is one of the plurality of external connection terminals, and the drain electrode is connected to the metal plate for power storage tab joint via a conductive adhesive component.

14. A power storage pack comprising:

a first semiconductor device and a second semiconductor device each of which is the semiconductor device according to claim 5;

a fourth metal plate that is the second metal plate joined to the joint preparation region in the first semiconductor device;

a fifth metal plate that is the second metal plate joined to the joint preparation region in the second semiconductor device;

the mounting substrate on which a first semiconductor element that is the semiconductor element in the first semiconductor device and a second semiconductor element that is the semiconductor element in the second semiconductor device are mounted; and a power storage cell, wherein the fourth metal plate is a first power storage tab connected to a positive electrode terminal of the power storage cell, the fifth metal plate is a second power storage tab connected to a negative electrode terminal of the power storage cell, the mounting substrate is a protection circuit substrate that protects the power storage cell from overcharge or overdischarge, the first metal plate in the first semiconductor device is a first metal plate for power storage tab joint to be joined to the first power storage tab, the first metal plate in the second semiconductor device is a second metal plate for power storage tab joint to be joined to the second power storage tab, the first semiconductor element is a first switching element, the second semiconductor element is a second switching element, a current path, along which current flows from the power storage cell in order of the power storage cell, the first power storage tab, the first metal plate for power storage tab joint, and the first semiconductor element, or in reverse order, is formed, a current path, along which current flows from the power storage cell in order of the power storage cell, the second power storage tab, the second metal plate for power storage tab joint, the second semiconductor element, or in reverse order, is formed, the first switching element and the second switching element control charging or discharging of the power storage cell in the protection circuit substrate, the substrate connection terminal in the first switching element comprises a plurality of substrate connection terminals, the substrate connection terminal in the second switching element comprises a plurality of substrate connection terminals, and the power storage pack further comprises:

first wiring provided on the protection circuit substrate, having a same electric potential as the first power storage tab, and connected to a first substrate connection terminal that is one of the plurality of substrate connection terminals in the first switching element;

second wiring provided on the protection circuit substrate and connected to one of the plurality of substrate connection terminals in the first switching element that exclude the first substrate connection terminal;

a power storage pack positive electrode terminal connected to the second wiring;

third wiring provided on the protection circuit substrate, having a same electric potential as the second power storage tab, and connected to a second substrate connection terminal that is one of the plurality of substrate connection terminals in the second switching element;

fourth wiring provided on the protection circuit substrate and connected to one of the plurality of substrate connection terminals in the second switching element that exclude the second substrate connection terminal; and a power storage pack negative electrode terminal connected to the fourth wiring.

15. A power storage pack comprising:

a first semiconductor device that is the semiconductor device according to claim 5;

a fourth metal plate that is the second metal plate joined to the joint preparation region in the first semiconductor device;

the mounting substrate on which a first semiconductor element that is the semiconductor element in the first semiconductor device is mounted;

a second semiconductor element of chip-size package type that is face-down mounted on the mounting substrate;

a power storage cell;

a second power storage tab connected to a positive electrode terminal of the power storage cell; and a second metal plate for power storage tab joint that is connected to the second semiconductor element on a third main surface of the second metal plate, joined to the second power storage tab on a fourth main surface of the second metal plate, and including a portion whose thickness is at most 0.2 mm, the fourth main surface and the third main surface facing in opposite directions, wherein the fourth metal plate is a first power storage tab connected to a negative electrode terminal of the power storage cell, the mounting substrate is a protection circuit substrate that protects the power storage cell from overcharge or overdischarge, the first metal plate in the first semiconductor device is a first metal plate for power storage tab joint to be joined to the first power storage tab, the first semiconductor element is a first switching element, the second semiconductor element is a second switching element, a current path, along which current flows from the power storage cell in order of the power storage cell, the first power storage tab, the first metal plate for power storage tab joint, and the first semiconductor element, or in reverse order, is formed, a current path, along which current flows from the power storage cell in order of the power storage cell, the second power storage tab, the second metal plate for power storage tab joint, and the protection circuit substrate, or in reverse order, is formed, in a plan view of the protection circuit substrate, there is an overlap portion in which the second power storage tab, the second metal plate for power storage tab joint, the second semiconductor element, and the protection circuit substrate overlap each other, in the plan view of the protection circuit substrate, there is a portion in which a region through which current flows between the second power storage tab and the protection circuit substrate overlaps the overlap portion, the second metal plate for power storage tab joint is bent to include a portion in which fourth main surfaces face each other, in the plan view of the second metal plate for power storage tab joint in a state before being bent, a region in which the second metal plate for power storage tab joint is joined to the second power storage tab does not overlap a region in which the second metal plate for power storage tab joint is connected to the second semiconductor element, the first switching element and the second switching element control charging or discharging of the power storage cell in the protection circuit substrate, the substrate connection terminal in the first switching element comprises a plurality of substrate connection terminals, and the power storage pack further comprises:
first wiring provided on the protection circuit substrate, having a same electric potential as the first power storage tab, and connected to a first substrate connection terminal that is one of the plurality of substrate connection terminals in the first switching element;
second wiring provided on the protection circuit substrate and connected to one of the plurality of substrate connection terminals in the first switching element that exclude the first substrate connection terminal;
third wiring provided on the protection circuit substrate and connected to the second wiring via the second switching element;
a power storage pack negative electrode terminal connected to the third wiring;
fourth wiring provided on the protection circuit substrate and having a same electric potential as the second power storage tab; and
a power storage pack positive electrode terminal connected to the fourth wiring.

16. A power storage pack comprising the semiconductor device, the second metal plate, and the mounting substrate according to claim 1, and a power storage cell, wherein
the second metal plate is joined to the first metal plate in the joint preparation region,
the second metal plate is a power storage tab connected to the power storage cell and serves as a conduction path for charging or discharging the power storage cell,
the first metal plate is a metal plate for power storage tab joint which is to be joined to the power storage tab,
the mounting substrate is a protection circuit substrate that protects the power storage cell from overcharge or overdischarge,
a current path, along which current flows from the power storage cell in order of the power storage cell, the power storage tab, the metal plate for power storage tab joint, and the semiconductor element, or in reverse order, is formed,
the semiconductor element is a switching element, and
the switching element controls the charging or discharging of the power storage cell in the protection circuit substrate.

17. A semiconductor device comprising:
a semiconductor element of chip-size package type including a plurality of external connection terminals; and
a first metal plate including a portion whose thickness is at most 0.2 mm, wherein
the semiconductor element includes one main surface to which the first metal plate is connected,
the semiconductor element includes an other main surface that includes a substrate connection terminal to be connected to a mounting substrate on which the semiconductor element is mounted, the other main surface and the one main surface facing in opposite directions, the substrate connection terminal being included in the plurality of external connection terminals,
the first metal plate includes a first main surface connected to the semiconductor element and a second main surface on which a joint preparation region for joining the first metal plate and a second metal plate is provided, the second main surface and the first main surface facing in opposite directions,
in a plan view of the first metal plate, the joint preparation region does not overlap a connection region in which the first metal plate is connected to the semiconductor element,
the first metal plate has a same electric potential as at least one of the plurality of external connection terminals,
the first metal plate is bendable at the portion whose thickness is at most 0.2 mm to include a portion in which second main surfaces face each other,
the semiconductor device further comprises a third metal plate between the semiconductor element and the first metal plate,
the third metal plate is connected to the semiconductor element on the one main surface of the semiconductor element and is connected to the first metal plate on the first main surface of the first metal plate, and the first metal plate is connected to the one main surface of the semiconductor element via the third metal plate.

18. The semiconductor device according to claim 17, further comprising:
one or more metal components on a main surface, of the third metal plate, on which the third metal plate is connected to the semiconductor element, the one or more metal components being to be mounted on the mounting substrate together with the semiconductor element when the semiconductor element is mounted on the mounting substrate, wherein
in the plan view of the first metal plate, each of regions in which the main surface of the third metal plate is connected to the one or more metal components does not overlap the joint preparation region.

* * * * *